(12) United States Patent
Jang et al.

(10) Patent No.: US 11,805,633 B2
(45) Date of Patent: Oct. 31, 2023

(54) ELECTRICAL ELEMENT TRANSFER APPARATUS

(71) Applicant: SAMSUNG ELECTRONICS CO., LTD., Suwon-si (KR)

(72) Inventors: Hyun-Tae Jang, Seoul (KR); Min Park, Suwon-si (KR); Byung Hoon Lee, Hwaseong-si (KR); Youngchul Lee, Hwaseong-si (KR); Changjoon Lee, Gwangmyeong-si (KR); Jiyoung Jang, Seongnam-si (KR); Youngjun Moon, Hwaseong-si (KR); Minyoung Park, Suwon-si (KR); Jeonggen Yoon, Suwon-si (KR); Won Choi, Hwaseong-si (KR); Siho Jang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 547 days.

(21) Appl. No.: 16/638,645

(22) PCT Filed: Jul. 11, 2018

(86) PCT No.: PCT/KR2018/007836
§ 371 (c)(1),
(2) Date: Feb. 12, 2020

(87) PCT Pub. No.: WO2019/035557
PCT Pub. Date: Feb. 21, 2019

(65) Prior Publication Data
US 2021/0136966 A1    May 6, 2021

Related U.S. Application Data

(60) Provisional application No. PCT/KR2018/007836, filed on Jul. 11, 2018.

(30) Foreign Application Priority Data

Aug. 14, 2017   (KR) .................. 10-2017-0102922
Sep. 4, 2017    (KR) .................. 10-2017-0112421
Jun. 18, 2018   (KR) .................. 10-2018-0069718

(51) Int. Cl.
*H05K 13/04*     (2006.01)
*H01L 33/00*     (2010.01)
*H05K 13/02*     (2006.01)

(52) U.S. Cl.
CPC ......... *H05K 13/041* (2018.08); *H01L 33/005* (2013.01); *H05K 13/02* (2013.01); *H05K 13/0409* (2018.08); *Y10T 29/53174* (2015.01)

(58) Field of Classification Search
CPC ......... H01L 21/67742; H01L 21/67748; H01L 21/67144; H01L 21/67; H01L 21/68;
(Continued)

(56) References Cited

U.S. PATENT DOCUMENTS 8,573,469 B2 * 11/2013  Hu ..................... H01L 24/75
                                          438/455
9,698,134 B2 *  7/2017  Li ..................... H01L 25/0753
(Continued)

FOREIGN PATENT DOCUMENTS

CN    107026124     8/2017
JP    2005-353707   12/2005
(Continued)

OTHER PUBLICATIONS

International Search Report for PCT/KR2018/007836, dated Oct. 19, 2018, 8 pages.
(Continued)

*Primary Examiner* — Thiem D Phan
(74) *Attorney, Agent, or Firm* — Nixon & Vanderhye, P.C.

(57) ABSTRACT

According to various embodiments, provided is an electrical element transfer apparatus comprising: a fixing jig in which
(Continued)

each of a plurality of electrical elements is arranged at a predetermined interval; a movement jig movably arranged at an upper part of the fixing jig, and including a plurality of first accommodating grooves for accommodating at least a part of each of the plurality of electrical elements; and an attraction device arranged around the movable jig and attaching each of the plurality of electrical elements through the movable jig to the first accommodating groove of the movable jig through magnetic force. Additional various embodiments are possible.

5 Claims, 26 Drawing Sheets

(58) Field of Classification Search
CPC ......... H01L 21/67121; H01L 21/67709; H01L 21/67766; Y10T 29/5313; Y10T 29/53174; Y10T 29/53191; Y10T 29/53261; Y10T 279/11; Y10T 29/53196; H05K 13/041
USPC .......... 29/739, 601, 740, 743, 744, 829, 845
See application file for complete search history.

(56) References Cited

U.S. PATENT DOCUMENTS

| | | |
|---|---|---|
| 2008/0121724 A1 | 5/2008 | Beer et al. |
| 2010/0123268 A1 | 5/2010 | Menard |
| 2012/0043005 A1 | 2/2012 | Yamakami et al. |
| 2013/0126081 A1 | 5/2013 | Hu et al. |
| 2016/0155892 A1 | 6/2016 | Li et al. |
| 2016/0293566 A1 | 10/2016 | Golda et al. |
| 2017/0018613 A1 | 1/2017 | Bibl et al. |
| 2017/0034916 A1 | 2/2017 | Yamagami et al. |

FOREIGN PATENT DOCUMENTS

| | | |
|---|---|---|
| JP | 2006-140398 | 6/2006 |
| JP | 2006-172166 | 6/2006 |
| JP | 2009-253019 | 10/2009 |
| JP | 5612963 | 10/2014 |
| KR | 10-2004-0009803 | 1/2004 |
| KR | 10-0948800 | 3/2010 |
| KR | 10-2012-0101868 | 9/2012 |
| KR | 10-2013-0031502 | 3/2013 |
| KR | 10-2014-0103279 | 8/2014 |
| KR | 10-2014-0109890 | 9/2014 |
| KR | 10-1731932 | 5/2017 |

OTHER PUBLICATIONS

Written Opinion of the ISA for PCT/KR2018/007836, dated Oct. 19, 2018, 5 pages.
Office Action dated Jan. 16, 2023 in Korean Patent Application No. 10-2018-0069718 and English-language translation.
Office Action dated Feb. 15, 2023 in Chinese Patent Application No. 201880052299.1 and English-language translation.
Notice of Patent Grant dated Jun. 27, 2023 in Korean Patent Application No. 10-2018-0069718 and English-language translation.

* cited by examiner

ELECTRICAL ELEMENT TRANSFER APPARATUS

This application is the U.S. national phase of International Application No. PCT/KR2018/007836 filed 11 Jul. 2018, which designated the U.S. and claims priority to KR Patent Application No. 10-2017-0102922 filed 14 Aug. 2017, KR Patent Application No. 10-2017-0112421 filed 4 Sep. 2017, and KR Patent Application No. 10-2018-0069718 filed 18 Jun. 2018, the entire contents of each of which are hereby incorporated by reference.

BACKGROUND

Field

Various embodiments of the disclosure relate to a transfer apparatus for an electrical element.

Description of Related Art

It is a recent trend to substitute electrical elements such as micro light emitting diodes (LEDs) with pixels of a display. Since a long distance display (for example, an outdoor long distance display) uses an LED package of a size of a few mm, the display is not appropriate for a short distance or home use. Accordingly, in order to implement a short distance display, problems regarding how exactly an LED of a size of tens to hundreds of μm corresponding to a current pixel is transferred to a board and whether the transferring is performed at a high yield rate should be solved first. A size of one pixel of a household display which is being currently developed is normally about 100 μm, and a size of an R/G/B sub pixel constituting one pixel is merely tens of μm.

LEDs having a size of tens of μm corresponding to a size of a pixel applied to a short distance display size are mass-produced and fabricated, and various transferring technologies for transferring and mounting fabricated LEDs onto a board rapidly, exactly, and at a low error rate are being researched.

SUMMARY

Since a micro LED applied to a pixel of a short distance display has a range from 30-40 μm in size, the micro LED may be fabricated on a basic material board (for example, a wafer, a sapphire board, a quartz board) by using semiconductor processing technology. According to an embodiment, the micro LED fabricated in this way should be mounted on a board (printed circuit board (PCB)) of a display, and should be transferred exactly, rapidly, and at a low error rate. In particular, a multi-chip transfer method of transferring a plurality of micro LEDs to a board at a time may be used as a transfer method. As the multi-chip transfer method, an existing method of transferring a plurality of micro LEDs from a base material board to a display board by using a stamp, a tape or a high speed mounter may be used, and there may be problems that an error rate of a process is high and a transfer speed is low.

Various embodiments of the disclosure provide an electrical element transfer apparatus which has a high transfer speed and a low error rate.

The disclosure provides a redistribution device which can exactly pick up a micro LED chip by using a porous material portion and an adhesive force of a tape, and can perform an exact pickup operation of a micro LED chip by using an adsorption force provided by a vacuum portion, a porous material portion and a tape, or can prevent a micro LED chip which is not picked up and is adjacent to a picked-up micro LED chip from being warped.

According to various embodiments, there is provided an electrical element transfer apparatus including: a fixing jig in which each of the plurality of electrical elements is disposed at predetermined intervals; a movement jig which is movably disposed on an upper portion of the fixing jig, and includes a plurality of first accommodation grooves to accommodate at least a part of each of the plurality of electrical elements; and an attraction device which is disposed in the proximity of the movement jig and is configured to attach each of the plurality of electrical elements to the first accommodation groove of the movement jig by using magnetism through the movement jig.

According to various embodiments, there is provided a transfer apparatus of a micro LED chip, the transfer apparatus including: a second device on which a carrier film to which a plurality of micro LED chips are fixed is placed; and a first device which includes a first vacuum portion, a first porous material portion including a plurality of first penetrating openings spatially connected with the first vacuum portion, and coupled to the first vacuum portion, and a first adhesive member fixed to the first porous material portion and adsorbed onto the first porous material portion by the first vacuum portion, wherein the first device is configured to selectively pick up and transfer the plurality of prepared micro LED chips by an adhesive force of the first adhesive member, and each of the micro LED chips picked up and transferred is placed down by the first device and is redistributed on a temporary fixing film.

According to various embodiments, there is provided a micro LED transfer apparatus including: a fixing device on which a carrier film to which a plurality of micro LED chips are fixed is placed, and which is configured to hold a micro LED chip which is not picked up; and a pickup device configured to selectively pick up and transfer the plurality of micro LED chips, wherein the pickup device includes: a first vacuum portion; a first porous material portion including a plurality of first penetrating openings spatially connected with the first vacuum portion; and a first adhesive member fixed to the first porous material portion and adsorbed onto a portion of the first porous material portion according to an on-operation of the first vacuum portion, wherein the fixing device includes: a second vacuum portion; a second porous material portion including a plurality of second penetrating openings spatially connected with the second vacuum portion; and a second adhesive member fixed to the second porous material portion and adsorbed onto the second porous material portion by an on-operation of the second vacuum portion.

Various embodiments of the disclosure provide an alignment structure for aligning respective locations of electrical elements, in a fixing jig to redistribute electrical elements according to types, and a transfer jig to pick up the electrical elements arranged in the fixing jig and to transfer the electrical elements to a board (PCB) of an electronic device, and can transfer desired electrical elements to the board easily and rapidly by using the alignment structure and an element attraction device through a movement jig.

The transfer apparatus of the micro LED chips according to the disclosure can effectively reduce the time required to produce a micro LED display of a large image apparatus (for example, a TV) by exactly picking up and placing down the plurality of micro LED chips at a time, and redistributing the micro LED chips.

DETAILED DESCRIPTION

Figure 1A:
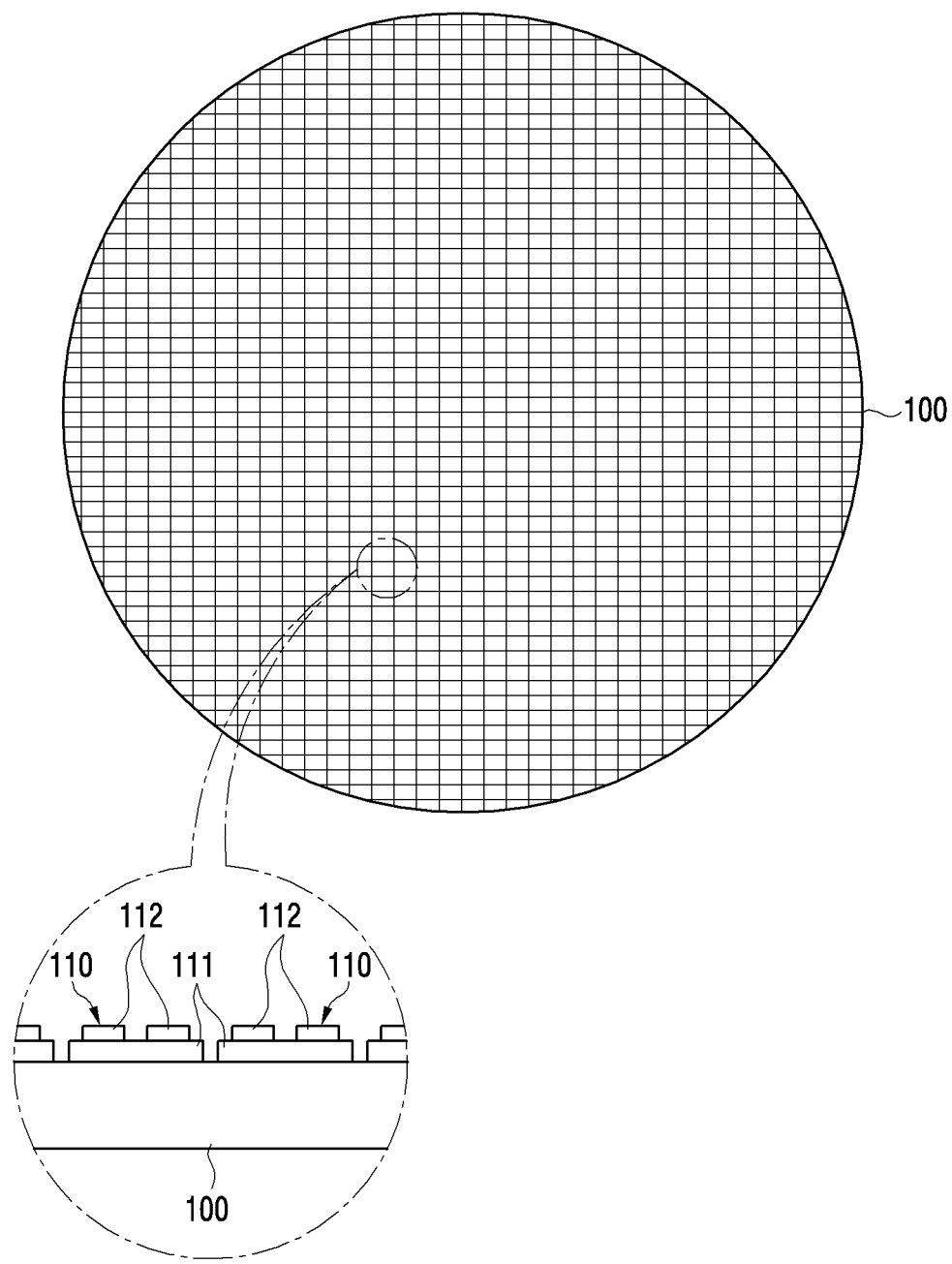
FIG. 1A is a configuration view illustrating a basic material board for fabricating a micro LED according to various embodiments of the disclosure.

Hereinafter, various embodiments of the disclosure will be described with reference to the accompanying drawings. It should be appreciated that the disclosure is not limited to specific embodiments and includes various modifications, equivalents, and/or alternatives of embodiments of the disclosure. With regard to the description of the drawings, similar reference numerals may be used to refer to similar elements.

In the disclosure, the expressions "have," "may have," "include" and "comprise," or "may include" and "may comprise" indicate existence of corresponding features (for example, elements such as numeric values, functions, operations, or components) and do not preclude the presence of additional features.

In the disclosure, the expressions "A or B," "at least one of A or/and B," or "one or more of A or/and B," and the like may include all possible combinations of the items enumerated together. For example, "A or B," "at least one of A and B," or "at least one of A or B" may refer to all of the case (1) where at least one A is included, the case (2) where at least one B is included, or the case (3) where both of at least one A and at least one B are included.

As used in various embodiments, such terms as "1st" and "2nd," or "first" and "second" may be used to simply distinguish a corresponding component from another, and does not limit the components in other aspect (e.g., importance and/or order). For example, "a first user device" and "a second user device" indicate different user devices regardless of the order or priority. For example, without departing from the scope of the disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element) between the element and another element.

According to the situation, the term "configured to (or set to)" used in the disclosure may be interchangeably used with the terms "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, "a processor configured (set) to perform A, B, and C" may refer, for example, and without limitation, to a dedicated processor (for example, an embedded processor) for performing a corresponding operation, or a generic-purpose processor (for example, a central processing unit (CPU) or an application processor (AP)), or the like, for performing corresponding operations by executing one or more software programs stored in a memory device.

Terms used in the disclosure are used to describe specified embodiments and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistant (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to some embodiments, the electronic devices may be home appliances. The home appliances include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and Play Station™), electronic dictionaries, electronic keys, camcorders, or electronic picture frames.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electricity or gas meters, sprinkler devices, fire alarms, thermostats, street lamps, toasters, exercise equipment, hot water tanks, heaters, boilers, or the like).

According to an embodiment, the electronic devices may include at least one of furniture, a part of buildings/structures, electronic boards, electronic signature receiving devices, projectors, or various measuring instruments (for example, water meters, electricity meters, gas meters, or wave meters). In various embodiments, the electronic devices may be one or a combination of two or more devices of the above-mentioned devices. According to a certain embodiment, the electronic device may be a flexible electronic device. Also, the electronic devices according to various embodiments of the disclosure are not limited to the above-mentioned devices, and may include new electronic devices according to technology development.

Hereinafter, a method for fabricating a display by using micro LED mounting technology according to various embodiments of the disclosure will be described with reference to the accompanying drawings.

Since a configuration of the display according to an exemplary embodiment of the disclosure can be implemented regardless of a size of an LED, there is no limit to the size of the used LED. For example, a display for illumination may use an LED of a few mm, a large display such as an outdoor/indoor signage may use an LED of hundreds of μm, and a display may use an LED of tens of μm.

Although exemplary embodiments of the disclosure illustrate and describe a transfer apparatus and a method for micro LEDs, this should not be considered as limiting. For example, various electrical elements which may use the transfer apparatus and the method disclosed in the disclosure may be applied.

FIG. 1A is a configuration view illustrating a basic material board for fabricating a micro LED according to various embodiments of the disclosure.

Referring to FIG. 1A, a micro LED 110 may have a size of tens of μm (for example, 30-40 μm) to be applied to sub pixels (for example, Pr, Pg, Pb of FIG. 3) constituting a pixel of a short distance display. A plurality of micro LEDs 110 may be fabricated by growing on a sapphire or SiX-based basic material board 100 (for example, a wafer) into a single crystal state of a compound semiconductor in a high temperature/high pressure state, and may be configured in different colors (for example, red, green, blue) according to each composition. For example, red may be configured by a compound semiconductor of GaAs, green may be configured by a compound semiconductor of InGaP, and blue may be configured by a compound semiconductor of GaN, and a wavelength may be determined according to a unique energy band gap value of each composition and different colors may be realized. According to an embodiment, the grown micro LEDs 110 may have electrically connected structures in which holes and electrons are provided, and may undergo semiconductor processes of tens of steps to emit light. In this case, one pair of connection pads 112 disposed to protrude from a body 111 of the micro LED 110 may be fabricated in a pad up type to face upward on the basic material board 100.

Figure 1B:
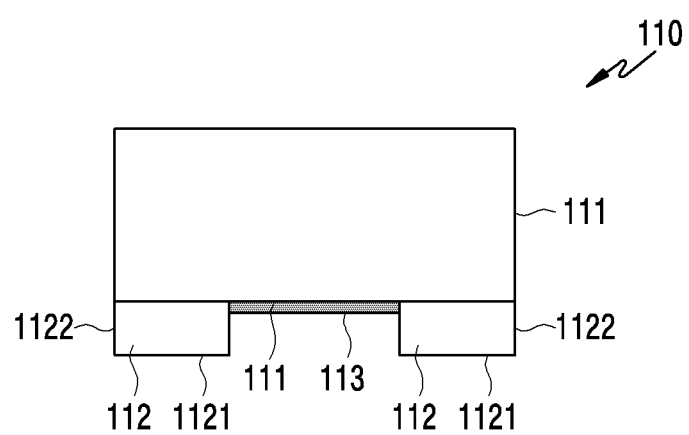
FIG. 1B is a configuration view of a micro LED according to various embodiments of the disclosure.

FIG. 1B is a configuration diagram of a micro LED according to various embodiments of the disclosure.

Referring to FIG. 1B, the micro LED 110 fabricated on a basic material board (for example, the basic material board 100 of FIG. 1A) may include a body 111 which is a light emitter, and one pair of connection pads 112 protruding from the body 111 at a predetermined interval. According to an embodiment, the micro LED 110 may be electrically connected with a conductive pad (for example, a solder pad) (for example, a conductive pad 241 of FIG. 3) disposed on a board (PCB) (for example, a board 240 of FIG. 3) of an electronic device (for example, a display) (for example, a display 800 of FIG. 8) by using a transfer apparatus (for example, a transfer apparatus 300 of FIG. 3) according to the disclosure, which will be described below. According to an embodiment, the micro LED 110 attached to the basic material board 100 may be detached from the basic material board 100 by using a laser lift-off (LLO) process through lasers (for example, gas lasers (eximer) or solid state (diode pumped solid state (DPSS)) lasers).

Figure 3:
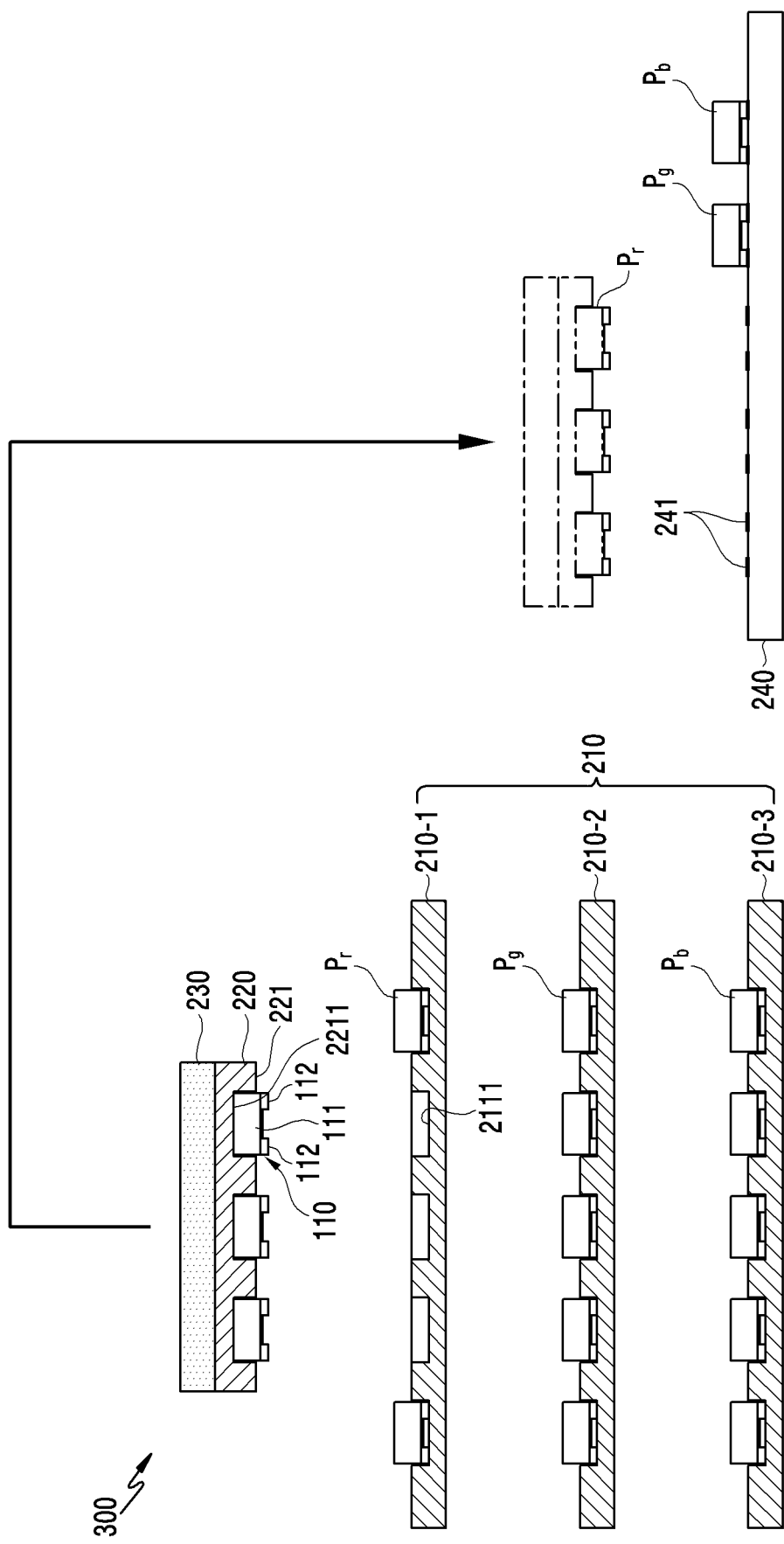
FIG. 3 is a view illustrating a schematic system of a transfer apparatus according to various embodiments of the disclosure.

According to various embodiments, the micro LED 1110 according to an exemplary embodiment of the disclosure may be attracted to a movement jig (for example, a movement jig 220 of FIG. 3) of the transfer apparatus (for example, the transfer apparatus 300 of FIG. 3) by an LED attraction device (for example, an attraction device 230 of FIG. 3) applied to the transfer apparatus (for example, the transfer apparatus 300 of FIG. 3). According to an embodiment, the micro LED 110 may include an element which is attracted by magnetism of the LED attraction device (for example, the attraction device 230 of FIG. 3). According to an embodiment, the element 113 may include a metallic member applied to at least some areas of the micro LED 110. According to an embodiment, the element 113 may include a nickel (Ni) layer which is coated over at least some areas of the micro LED 110. According to an embodiment, the nickel layer may be disposed on at least one area of a bottom surface of the body 111 of the micro LED 110, and a pad bottom surface 1121 or a pad side surface 1122 of the one pair of connection pads 113. Accordingly, the micro LED 110 may be attracted toward a bottom surface of the movement jig by magnetism of the LED attraction device (for example, the attraction device 230 of FIG. 3).

Figure 2:
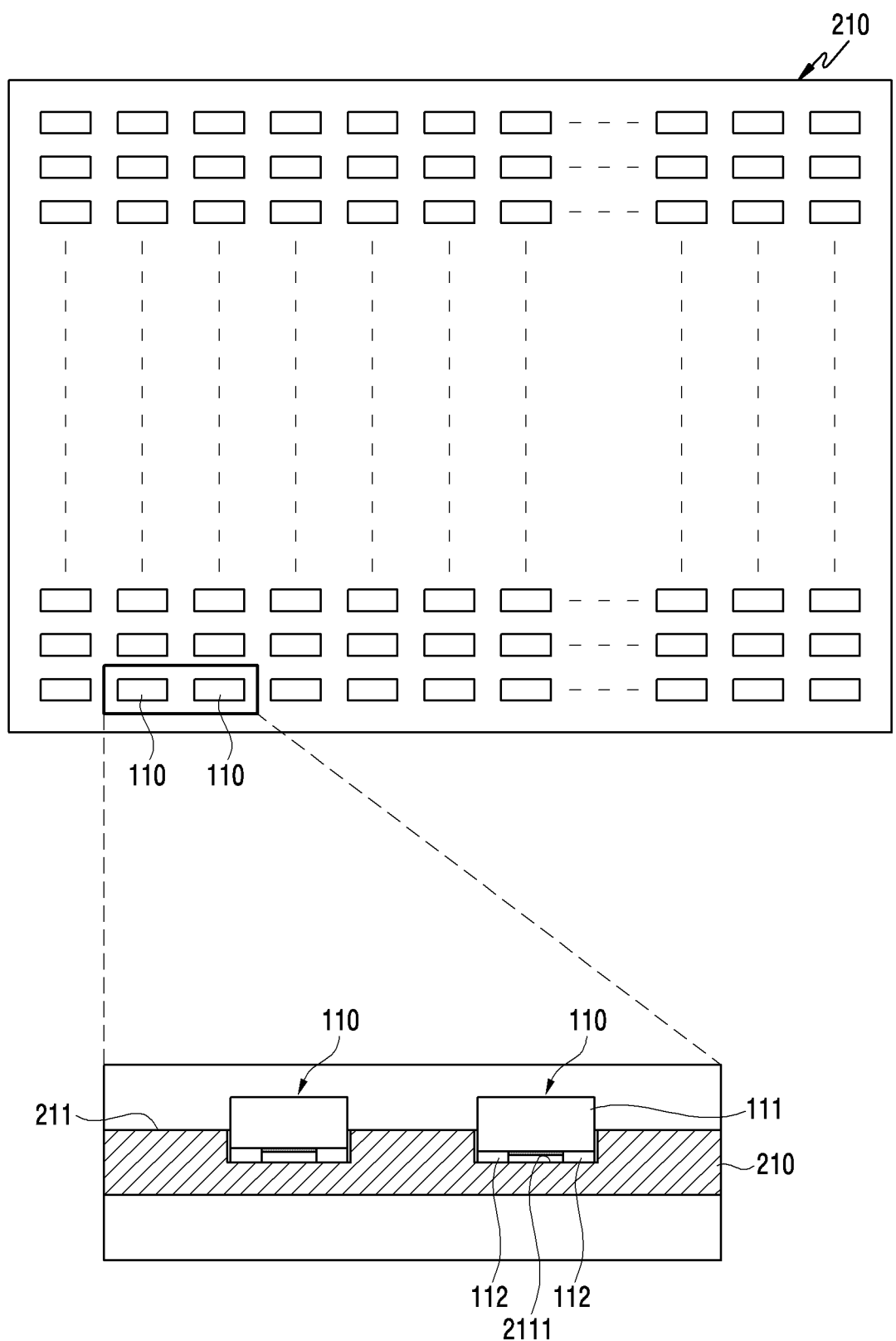
FIG. 2 is a view illustrating a configuration of a fixing jig according to various embodiments of the disclosure.

FIG. 2 is a view illustrating a configuration of a fixing jig according to various embodiments of the disclosure.

Referring to FIG. 2, the micro LEDs 110 fabricated on the basic material board 100 may be redistributed on at least one fixing jig 210. According to an embodiment, the micro LEDs 110 may be redistributed on the fixing jig 210 at predetermined intervals according to factors of a display pixel, for example, a pitch, color (R/G/B), a gap, etc. According to an embodiment, from among the micro LEDs 110 fabricated on the basic material board 100, only micro LEDs 110 determined as normally operating through a quality examination may be moved to the fixing jig 210 through a pickup device.

According to various embodiments, the fixing jig 210 may be configured on a basis of a sub pixel (for example, Pr, Pg, Pb) constituting a pixel of a display. For example, one fixing jig (for example, a first fixing jig 210-1 of FIG. 3) may accommodate only a plurality of micro LEDs 110 which realize R color. According to an embodiment, another fixing jig (for example, a second fixing jig 210-2 of FIG. 3) may accommodate only a plurality of micro LEDs 110 which realize G color. According to an embodiment, the other fixing jig (for example, a third fixing jig 210-3 of FIG. 3) may accommodate only a plurality of micro LEDs 110 which realize B color.

According to various embodiments, the fixing jig 210 may include first accommodation grooves 2111 formed on every location where the plurality of micro LEDs 110 are disposed to accommodate at least some areas of the micro LEDs 110. According to an embodiment, the first accommodation groove 2111 may be formed lower than an upper surface 211 of the fixing jig 210 facing toward a movement jig (for example, the movement jig 220 of FIG. 3). According to an embodiment, the first accommodation groove 2111 may be formed to a depth to accommodate from the connection pads 112 of the micro LED 110 which faces in a forward direction (for example, a direction in which the connection pads 112 face downward) after the micro LED 110 is transferred by the pickup device to at least a part of the body 111. According to an embodiment, the fixing jig 210 may be formed with a material such as nonmagnetic metal, plastic, ceramic, glass or silicon. According to an embodiment, when the micro LED 110 is accommodated in the first accommodation groove 2111, the location of the micro LED 110 may be restricted by the first accommodation groove 2111, and thus can be prevented from being arbitrarily moved. According to an embodiment, the first accommodation groove 2111 may be formed to have the same size as or to be larger than the micro LED 110.

FIG. 3 is a view illustrating a schematic system of a transfer apparatus according to various embodiments of the disclosure.

Referring to FIG. 3, the transfer apparatus 300 may include at least one fixing jig 210, a movement jig 220 disposed to be movable in a vertical direction from the ground above the fixing jig 210, and an attraction device 230 to attract at least one micro LED 110 arranged on the fixing jig 210 through the movement jig 220. According to an embodiment, the at least one fixing jig 210 may include a first fixing jig 210-1 in which a plurality of micro LEDs corresponding to sub pixels Pr realizing R color are arranged, a second fixing jig 210-2 in which a plurality of micro LEDs corresponding to sub pixels Pg realizing G color are arranged, and a third fixing jig 210-3 in which a plurality of micro LEDs corresponding to sub pixels Pb realizing B color are arranged.

According to various embodiments, the movement jig 220 may also include a second accommodation groove 2211 formed on a lower surface 221 facing toward the fixing jig 210 to be lower than the lower surface 221. According to an embodiment, the second accommodation groove 2211 may also be formed to a depth to accommodate at least a part of the micro LED 110 disposed in the first accommodation groove 2111 of the fixing jig 210. According to an embodiment, the micro LED 110 may be disposed to have at least some areas of the body 111 accommodated in the second accommodation groove 2211 of the movement jig 220. According to an embodiment, the movement jig 220 may also be formed with nonmagnetic metal, plastic, ceramic, glass or silicon.

According to various embodiments, the LED attraction device 230 may include a magnetism generation means to attract an element reacting to magnetism (for example, the element 113 reacting to magnetism in FIG. 1B). According to an embodiment, the magnetism generation means may include a ferrite magnet, a neodymium magnet, a rare-earth magnet or a normal metal magnet. According to an embodiment, the LED attraction device 230 for generating magnetism may be formed in a plate shape, a cylindrical shape, a coin shape, a protrusion shape, a whole coil shape, or a partial coil shape. According to an embodiment, the LED attraction device 230 may be selectively moved to the upper portion of the movement jig 220 in a substantially contact way, and may attract at least one micro LED 110 disposed in the fixing jig 210 to the second accommodation groove 2211 of the movement jig 220 by using magnetism.

According to various embodiments, the LED attraction device 230 for generating magnetism may be substituted with an electromagnet device which generates magnetism only when power is applied. In this case, the LED attraction device 230 may be integrally formed with the movement jig 220 or the movement jig 239 may be formed as an electromagnet without a separate attraction device.

According to various embodiments, the movement jig 220 including at least one micro LED 110 attracted by the LED attraction device 230 may be moved by a predetermined distance and may be positioned above a board (PCB) 240, and, by removing the magnetism of the LED attraction device 230 on alignment locations of the board 240 for the micro LEDs, the micro LEDs 110 may be disposed on the board 240. According to an embodiment, the micro LEDs 110 may be detached from the movement jig 220 and then may be mounted through a process (for example, soldering or the like) of electrically connecting the connection pads 112 to the conductive pads 231 of the board 240.

Figure 4:
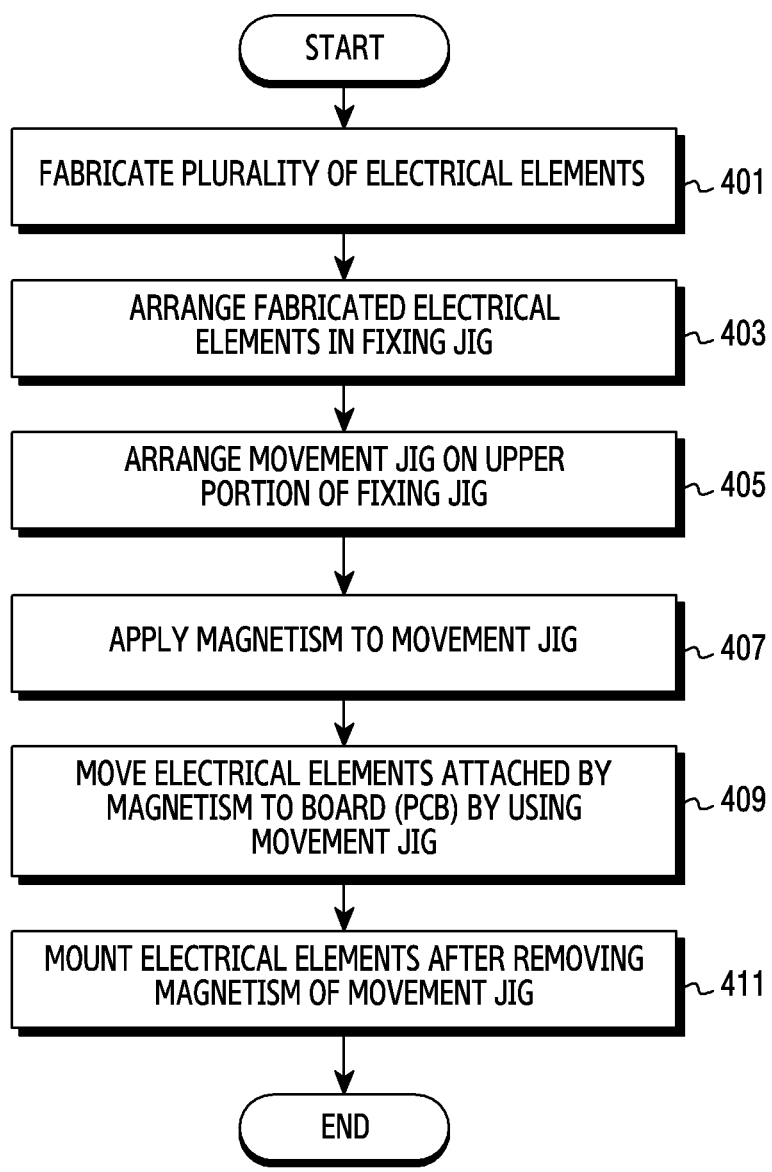
FIG. 4 is a process view illustrating a transfer process of micro LEDs according to various embodiments of the disclosure.

FIG. 4 is a process diagram illustrating a transfer process of micro LEDs according to various embodiments of the disclosure. FIGS. 5A to 5H are mimetic diagrams illustrating a transfer process of micro LEDs according to various embodiments of the disclosure.

Referring to FIG. 4, in operation 401, a plurality of electrical elements 110 may be fabricated. According to an embodiment, the electrical element 110 may include a micro LED 110 having a size of a sub pixel unit (for example, a size of 30-40 µm) constituting a pixel of a display (for example, the display 800 of FIG. 8). According to an embodiment, the micro LED 110 may be fabricated on a basic material board (for example, a wafer) (for example, the basic material board 100 of FIG. 1A) through semiconductor processes of a few steps.

Figure 5A:
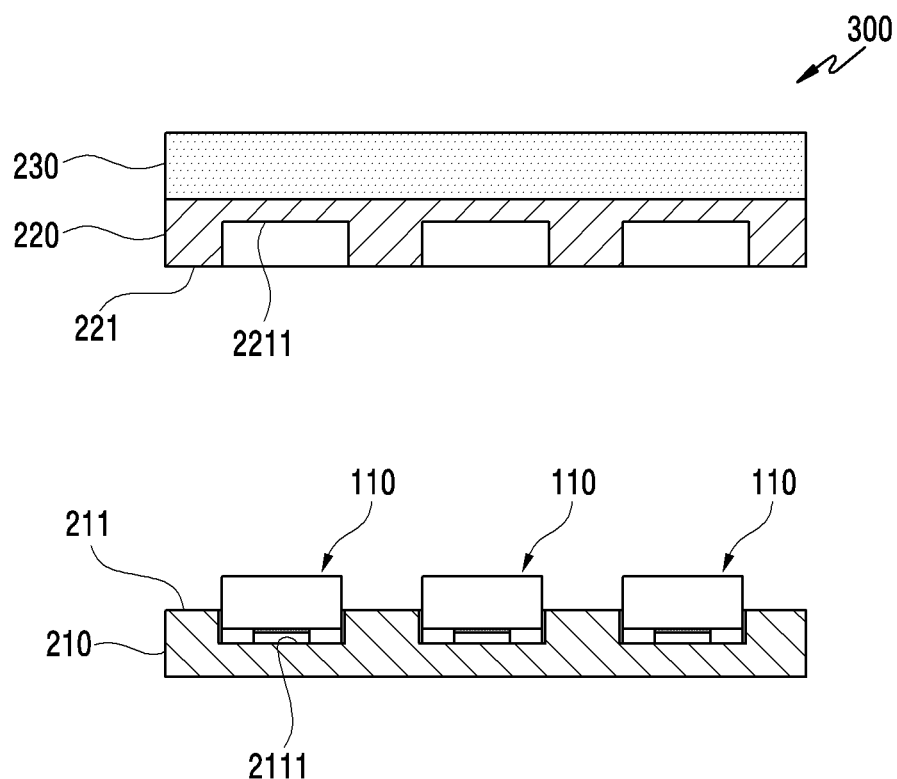
FIGS. 5A, 5B, 5C, 5D, 5E, 5F, 5G, and 5H are mimetic diagrams illustrating a transfer process of micro LEDs according to various embodiments of the disclosure.

Thereafter, in operation 403, the plurality of electrical elements (hereinafter, referred to as "micro LEDs") fabricated on the basic material board (for example, the basic material board 100 of FIG. 1A) may go through a cutting process (for example, singulation or flipping), and then may be arranged in the fixing jig 210 by a pickup device. According to an embodiment, as shown in FIG. 5A, the at least one fixing jig 210 can prevent the micro LEDs from being arbitrarily moved by accommodating at least some areas of each of the micro LEDs 110 on a plurality of first accommodation grooves 2111. According to an embodiment, the at least one fixing jig 210 may be configured to individually include the micro LEDs 110 in the unit of sub pixels (for example, sub pixels Pr, Pg, Pb of FIG. 8) constituting a pixel (for example, a pixel P of FIG. 8) of a display (for example, the display 800 of FIG. 8) according to each fixing jig 210. For example, one fixing jig (for example, the first fixing jig 210-1 of FIG. 3) may accommodate only the plurality of micro LEDs 110 realizing R color. According to an embodiment, another fixing jig (for example, the second fixing jig 210-2 of FIG. 3) may accommodate only the plurality of micro LEDs 110 realizing G color. According to an embodiment, the other fixing jig (for example, the third fixing jig 210-3 of FIG. 3) may accommodate only the plurality of micro LEDs 110 realizing B color.

Figure 5B:
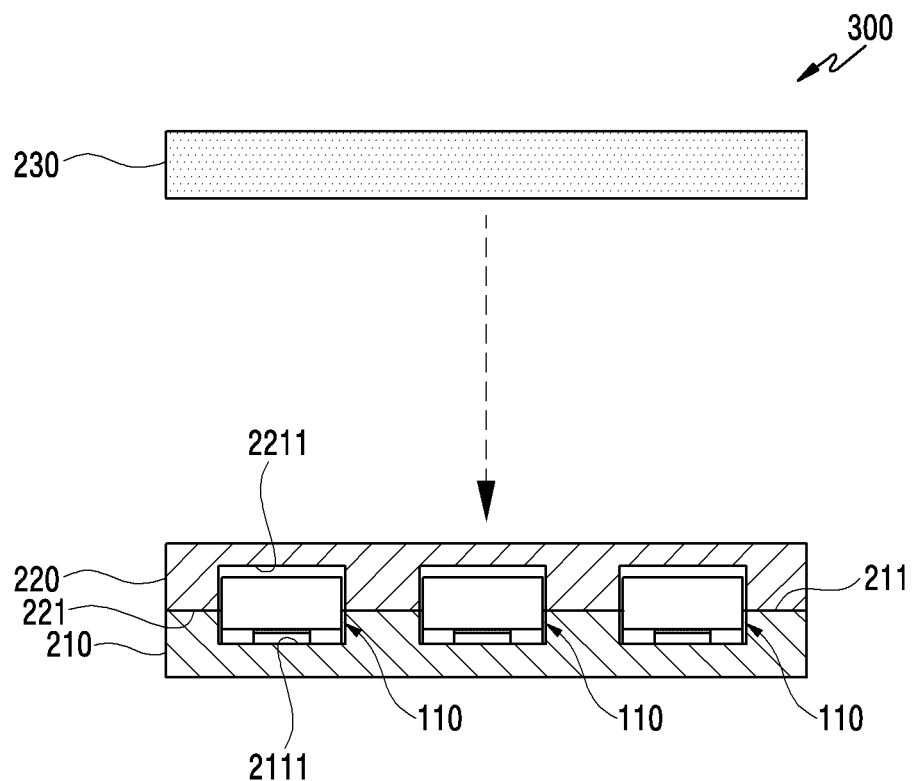

Thereafter, in operation 405, the movement jig 220 may be disposed on an upper portion of the fixing jig 210. Referring to FIGS. 5A and 5B, the micro LED 110 arranged in each of the plurality of first accommodation grooves 2111 may be accommodated in each of the second accommodation grooves 2211 formed on the bottom surface 221 of the movement jig 220 at least in part by an operation of moving the movement jig 2210 to the upper portion of the fixing jig 210. According to an embodiment, when the movement jig 220 is moved to the upper portion of the fixing jig 210, the first accommodation grooves 2111 of the fixing jig 210 and the second accommodation grooves 2211 of the movement jig 220 may be disposed to face each other, and the micro LEDs 110 may be disposed to be contained in spaces formed by the first accommodation grooves 2111 and the second accommodation grooves 2211.

Figure 5C:
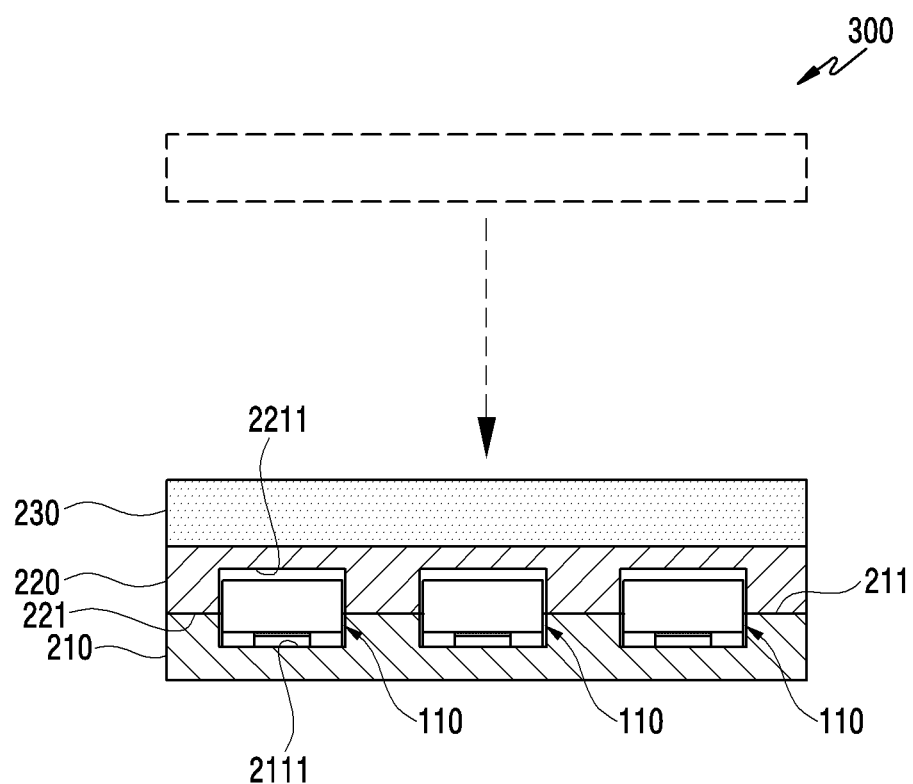

Thereafter, in operation 407, magnetism may be applied to the movement jig 220. According to an embodiment, in this case, the LED attraction device 230 may include a magnetism generation device to attract the micro LEDs 110 including the element reacting to magnetism (for example, the element 113 of FIG. 1B) to the movement jig 220 by using magnetism. Referring to FIGS. 5B and 5C, the LED attraction device 230 may be disposed on an upper portion of the movement jig 220 and may be moved toward the movement jig and may be disposed in the proximity of the movement jig 220 or in contact therewith.

Figure 5D:
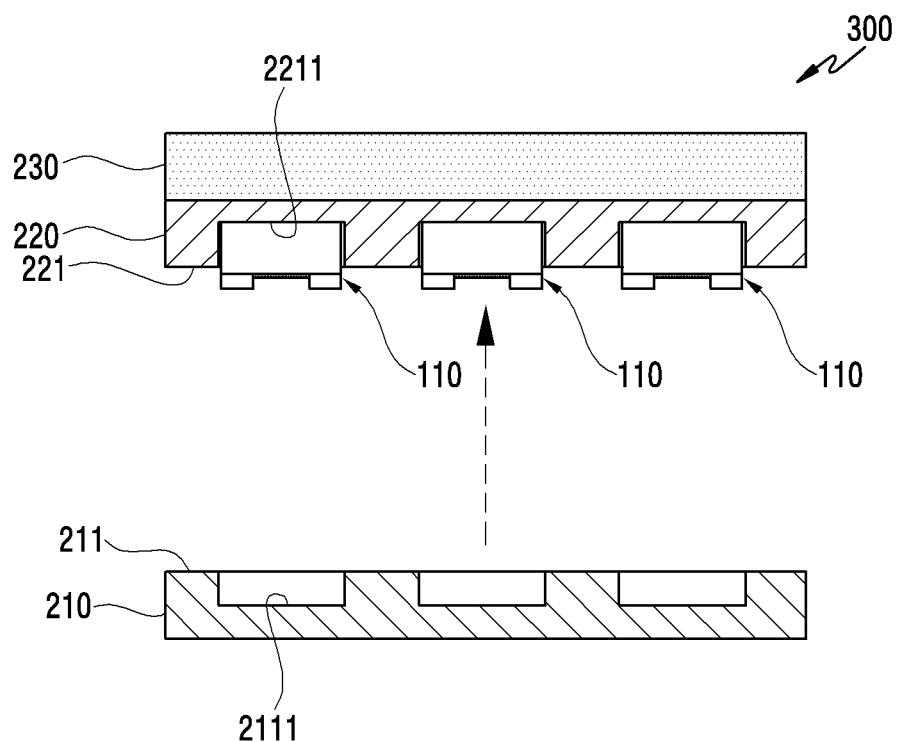
Figure 5E:
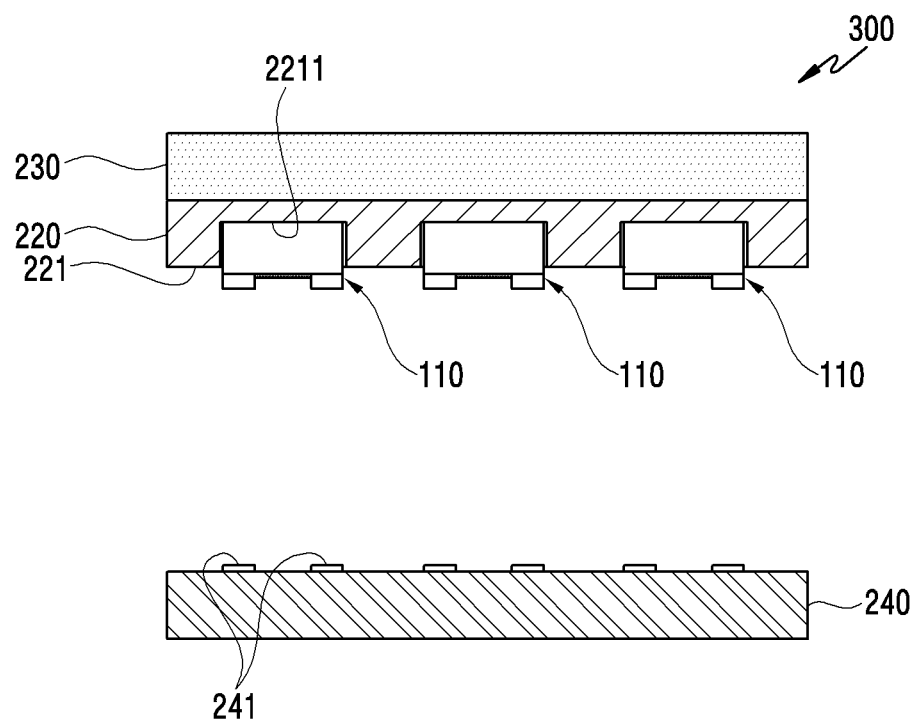

Thereafter, in operation 409, the micro LEDs 110 attached through the magnetism of the attraction device may be moved to the board (PCB) 240 by using the movement jig 220. Referring to FIGS. 5D and 5E, when magnetism is applied to the LED attraction device 230 disposed on the upper portion of the movement jig 220, the micro LEDs 110 seated in the first accommodation grooves 2111 of the fixing jig 210 may be moved to the second accommodation grooves 2211 of the movement jig 220 by the magnetism of the LED attraction device 230, and then, may be fixed to their locations. Thereafter, the movement jig 220 may be transferred to an upper portion of the board 240 (for example, a main board) used in an electronic device (for example, a display) by a transfer mechanism.

Figure 5F:
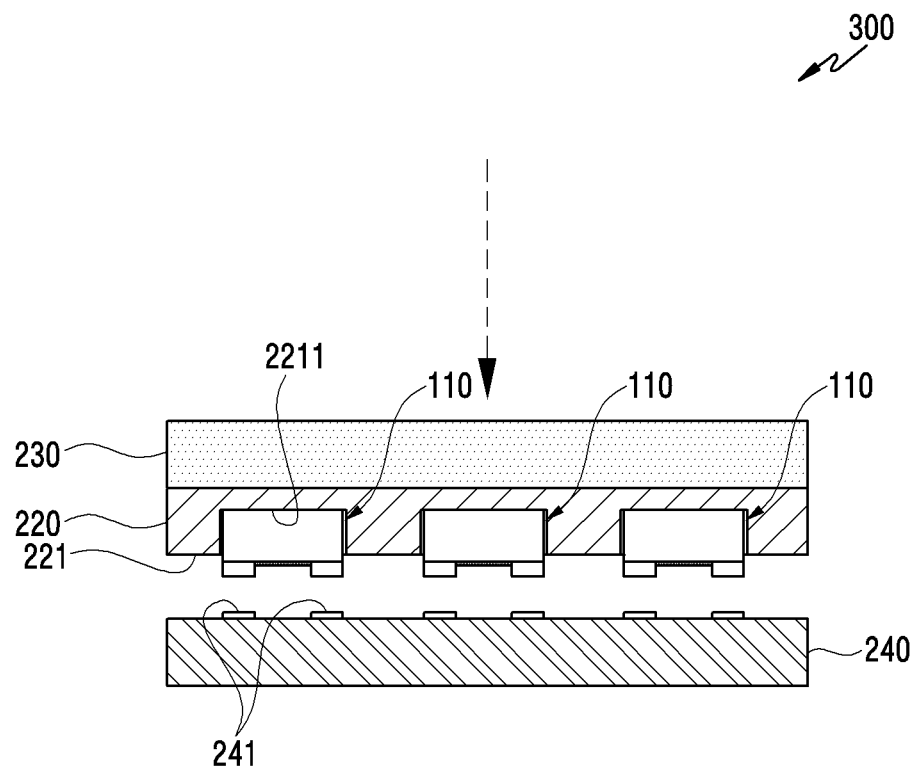
Figure 5G:
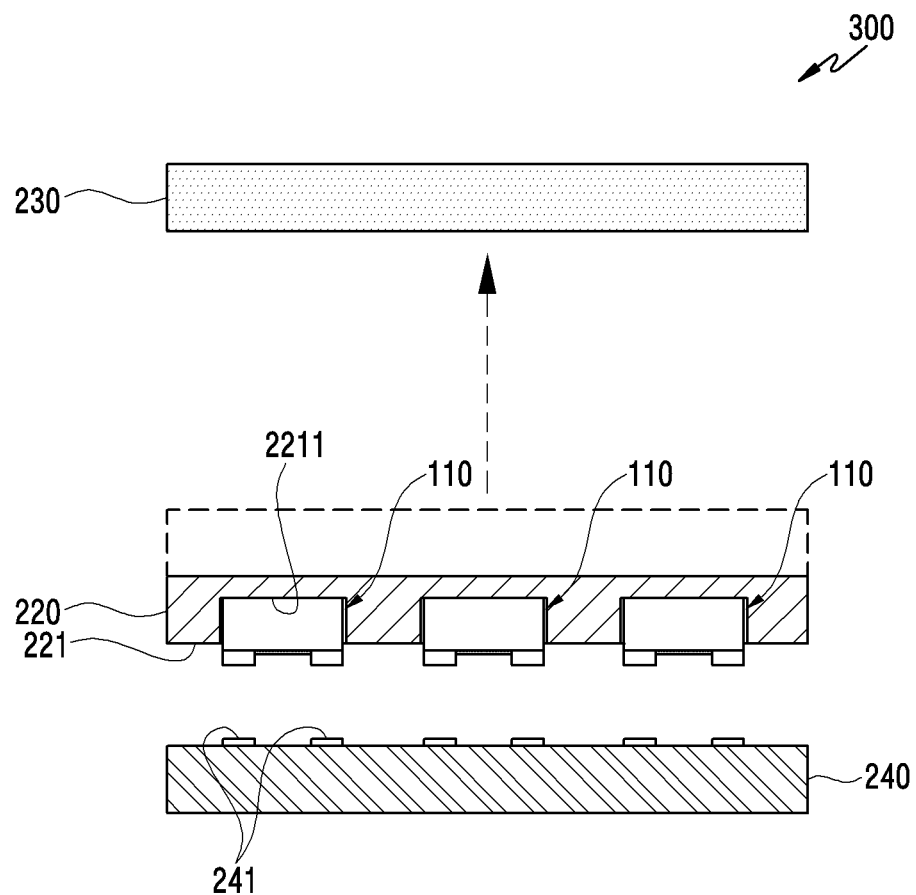
Figure 5H:
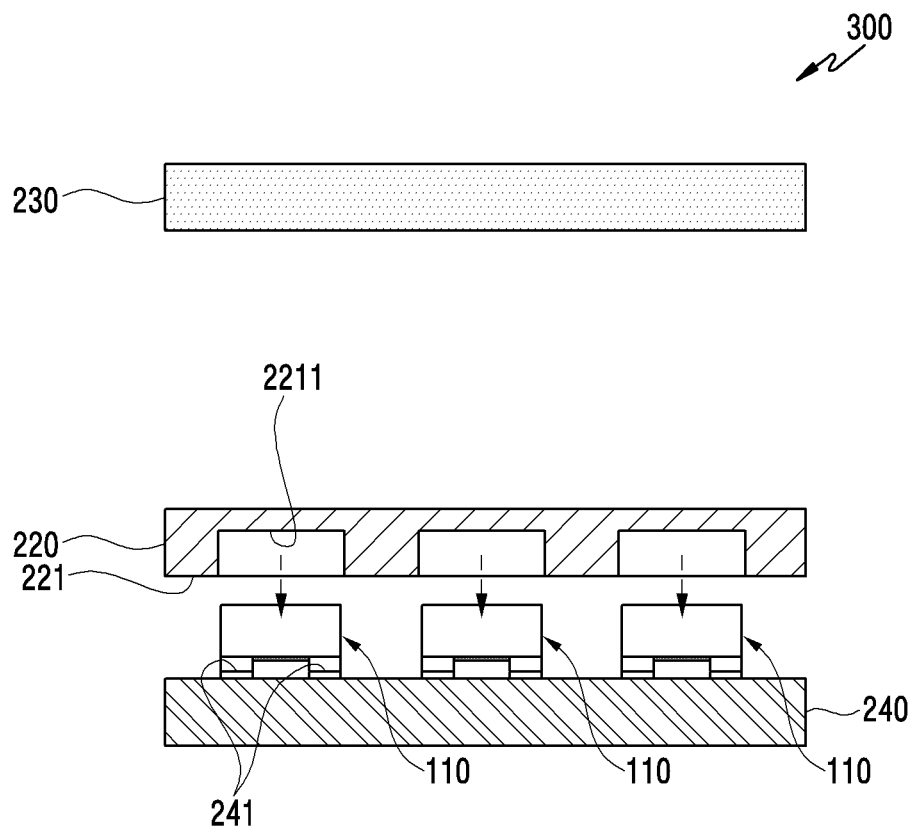

Thereafter, in operation 411, after the magnetism of the movement jig 220 is removed, the micro LEDs 110 may be mounted on the board 240. Referring to FIGS. 5F to 5H, the movement jig 220 may be moved to the upper portion of the board 240. For example, the movement jig 220 may be moved to have the connection pads 112 of the micro LEDs 110 approach or contact the upper portion of the board 240. According to an embodiment, after the movement jig 220 is moved to the upper portion of the board 240, the magnetism of the LED attraction device 230 may be removed. According to an embodiment, the magnetism of the LED attraction device 230 may be removed by moving the LED attraction device apart from the movement jig 220 or by electrically disconnecting magnetism applied to the LED attraction device (for example, in the case of an electromagnet). When the magnetism is removed from the movement jig 220, the micro LEDs 110 may be disposed in contact with the upper surface of the board 240. According to an embodiment, the micro LEDs 110 may be disposed in such a way that the connection pads 112 are physically in contact with the conductive pads 241 of the board 240, and may be electrically connected with the board 240 through an electrical bonding process (for example, soldering, conductive bonding, or the like).

FIGS. 6A to 6D are views illustrating a configuration of a fixing jig for aligning micro LEDs according to various embodiments of the disclosure.

Figure 6A:
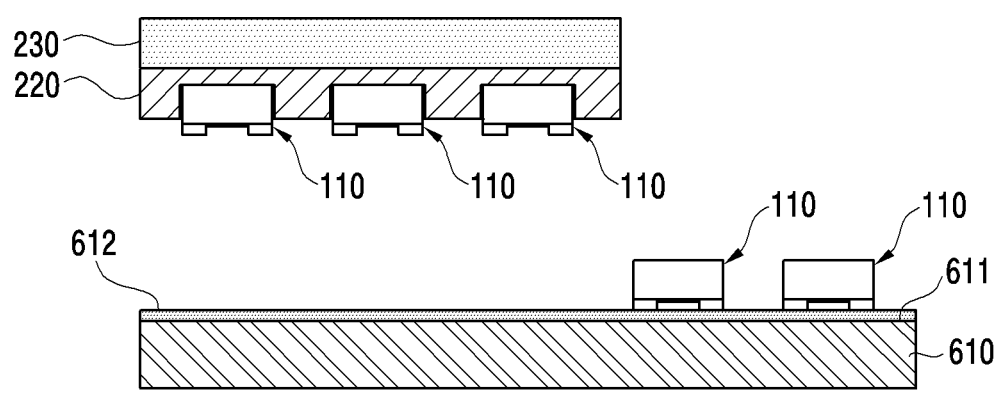
FIGS. 6A, 6B, 6C, and 6D are views illustrating a configuration of a fixing jig for aligning micro LEDs according to various embodiments of the disclosure.

Referring to FIG. 6A, the fixing jig 610 may not have a separate accommodation groove formed on an upper surface 611 thereof. According to an embodiment, instead of the accommodation groove, an adhesive member 612 may be disposed on the upper surface 611 of the fixing jig 610. According to an embodiment, the micro LEDs 110 may be transferred from a basic material board (for example, the basic material board 100 of FIG. 1A) and may be maintained on redistribution locations through the adhesive member 612 of the fixing jig 610. According to an embodiment, an adhering property of the adhesive member 612 may be set to be weaker than an attraction force (for example, magnetism, a vacuum suction force, or the like) of the attraction device 230 disposed on the upper portion of the movement jig 220. According to an embodiment, in this case, the fixing jig 610 may use the adhesive member 612 along with uncured resin (for example, liquid polyimide (PI), polydimethylsiloxane (PDMS), polyethylene terephthalate (PET), epoxy, or the like), a ultraviolet curing tape (UV tape), a non-UV tape, or a thermal foaming tape.

Figure 6B:
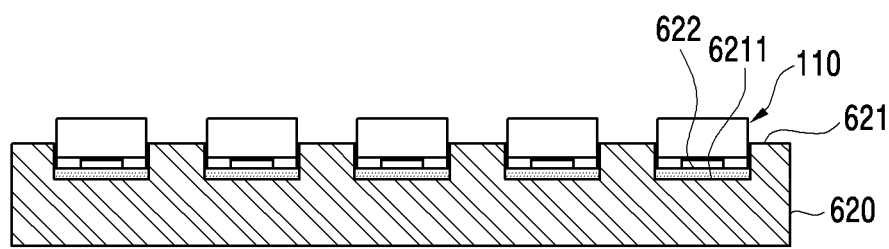

Referring to FIG. 6B, a fixing jig 620 may include an accommodation groove 6211 formed lower than an upper surface 621 to accommodate at least a part of the micro LED 110 as described above. According to an embodiment, an adhesive member 622 may be disposed on a bottom surface of the accommodation groove 6211. According to an embodiment, the adhesive member 622 may assist the function of the accommodation groove 6211 of preventing the micro LED 110 from being arbitrarily moved.

Figure 6C:
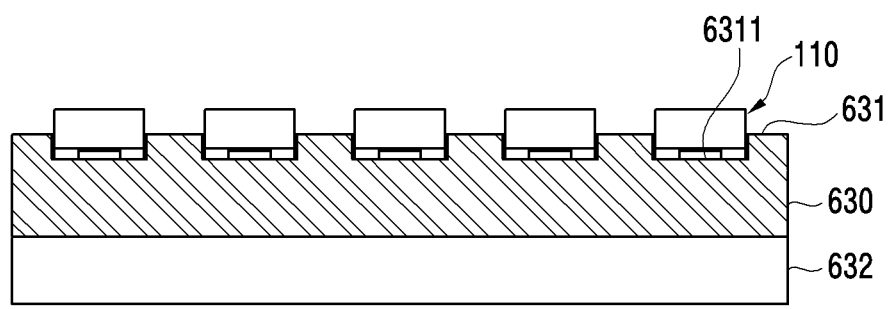

Referring to FIG. 6C, an LED attraction device 632 may be disposed on a lower side of a fixing jig 630. According to an embodiment, the LED attraction device 632 may include a magnetism generation device to maintain the micro LED 110 including an element reacting to magnetism (for example, the element 113 of FIG. 1B) in an accommodation groove 6311, which is formed lower than an upper surface 631 of the fixing jig 630. According to an embodiment, the LED attraction device 632 may use a magnet or an electromagnet of various materials described above.

Figure 6D:
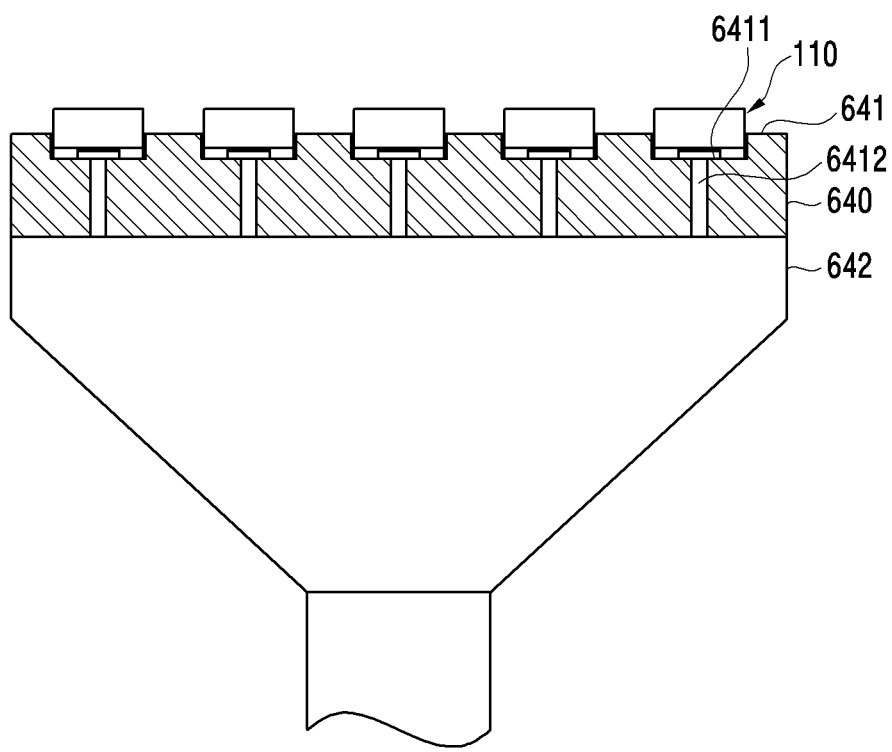

Referring to FIG. 6D, an LED attraction device 642 may be disposed on a lower side of a fixing jig 640. According to an embodiment, the LED attraction device 642 may include a vacuum device. According to an embodiment, the fixing jig 640 may include a plurality of accommodation grooves 6411 formed lower than an upper surface 641 to accommodate each of the micro LEDs 110. According to an embodiment, each of the accommodation grooves 6411 may have an air-intake hole 6412 formed from a lower surface of the accommodation groove 6411 to a bottom surface facing an upper surface of the fixing jig 640, and the LED attraction device 642 using vacuum suction may maintain a vacuum suction state through the air-intake hole 6412 to prevent the micro LED 110 accommodated in the accommodation groove 6411 from being released or arbitrarily moved from the accommodation groove 6411. According to an embodiment, the vacuum suction state maintained by the attraction device 642 may be selectively applied or removed according to whether the micro LEDs 110 are transferred by a movement jig (for example, the movement jig 220 of FIG. 3).

Figure 7:
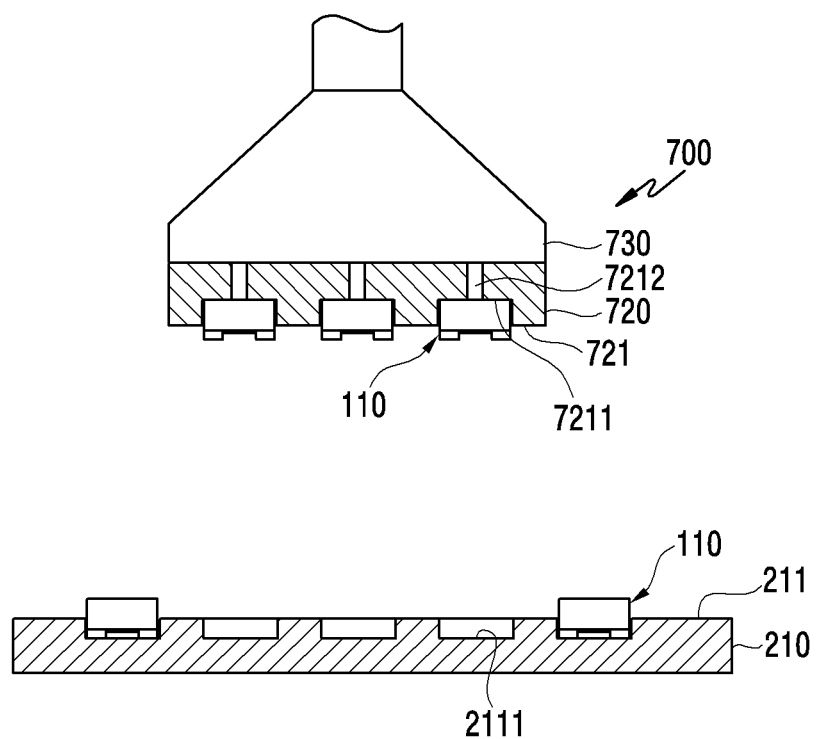
FIG. 7 is a configuration view of a transfer apparatus according to various embodiments of the disclosure.

FIG. 7 is a configuration diagram of a transfer apparatus according to various embodiments of the disclosure.

Referring to FIG. 7, the transfer apparatus 700 may include a movement jig 720 to which an LED attraction device 730 using vacuum suction is applied. According to an embodiment, the LED attraction device 730 may include a vacuum device. According to an embodiment, the movement jig 720 may include a plurality of accommodation grooves 7211 formed lower than a bottom surface 721 to accommodate the micro LEDs 110. According to an embodiment, each of the accommodation grooves 7211 may have an air-intake hole 7212 formed from a lower surface of the accommodation groove 7211 to an upper surface facing a bottom surface 721 of the movement jig 720, and the LED attraction device 730 using vacuum suction may maintain a vacuum suction state through the air-intake hole 7212 to prevent the micro LEDs 110 accommodated in the accommodation grooves 7211 from being released or arbitrarily moved from the accommodation grooves 7211 and to allow the micro LEDs 110 to be transferred to a board. According to an embodiment, the vacuum suction state maintained by the attraction device 730 may be selectively applied or removed according to whether the micro LEDs 110 are transferred by the movement jig 720.

Although not shown, the LED attraction device using vacuum suction or magnetism may be applied to the fixing jig or movement jig or may be applied to both of the fixing jig and the movement jig.

Figure 8:
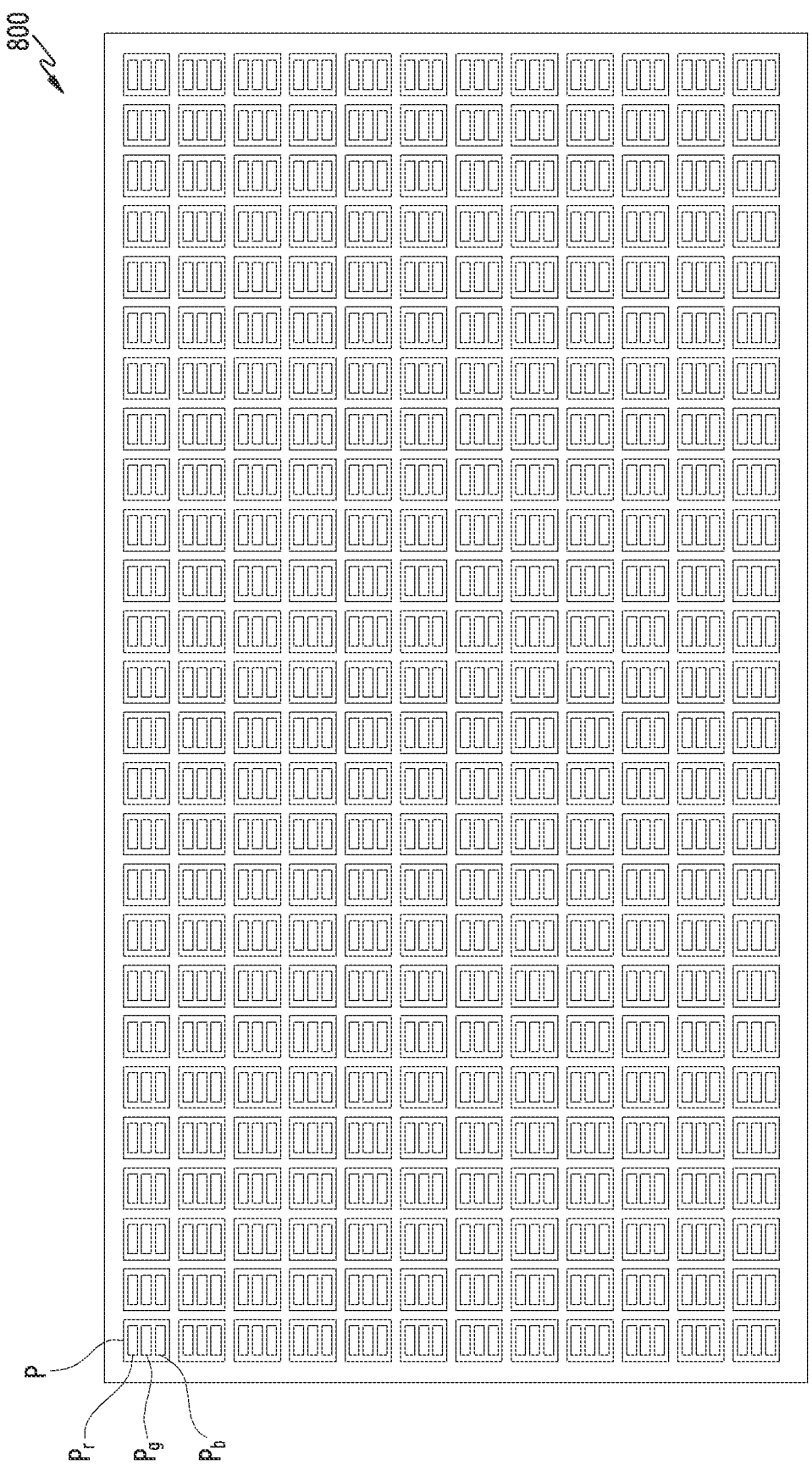
FIG. 8 is a view illustrating a screen configuration of a display which is fabricated by using micro LEDs transferred by a transfer apparatus according to various embodiments of the disclosure.

FIG. 8 is a view illustrating a screen configuration of a display which is fabricated by using micro LEDs transferred by using a transfer apparatus according to various embodiments of the disclosure.

FIG. 8 illustrates a state in which micro LEDs (for example, the micro LEDs 110 of FIG. 1A) corresponding to a pixel are disposed on corresponding locations on a board (for example, the board 240 of FIG. 3) of a display 800 after the micro LEDs (for example, the micro LEDs 110 of FIG. 1A) are redistributed in each fixing jig (for example, the fixing jig 210 of FIG. 2) according to sub pixels (Pr, Pg, Pb) from a basic material board (for example, the basic material board 100 of FIG. 1A) through the above-described transfer apparatus. According to an embodiment, the display 800 may have a plurality of pixels P arranged at predetermined intervals, and each of the pixels may include sub pixels Pr, Pg, Pb. According to an embodiment, the micro LEDs corresponding to the respective sub pixels Pr, Pg, Pb can be rapidly and exactly mounted on the board (for example, the board 240 of FIG. 3) of the display 800 by the transfer apparatus according to the disclosure.

Figure 9:
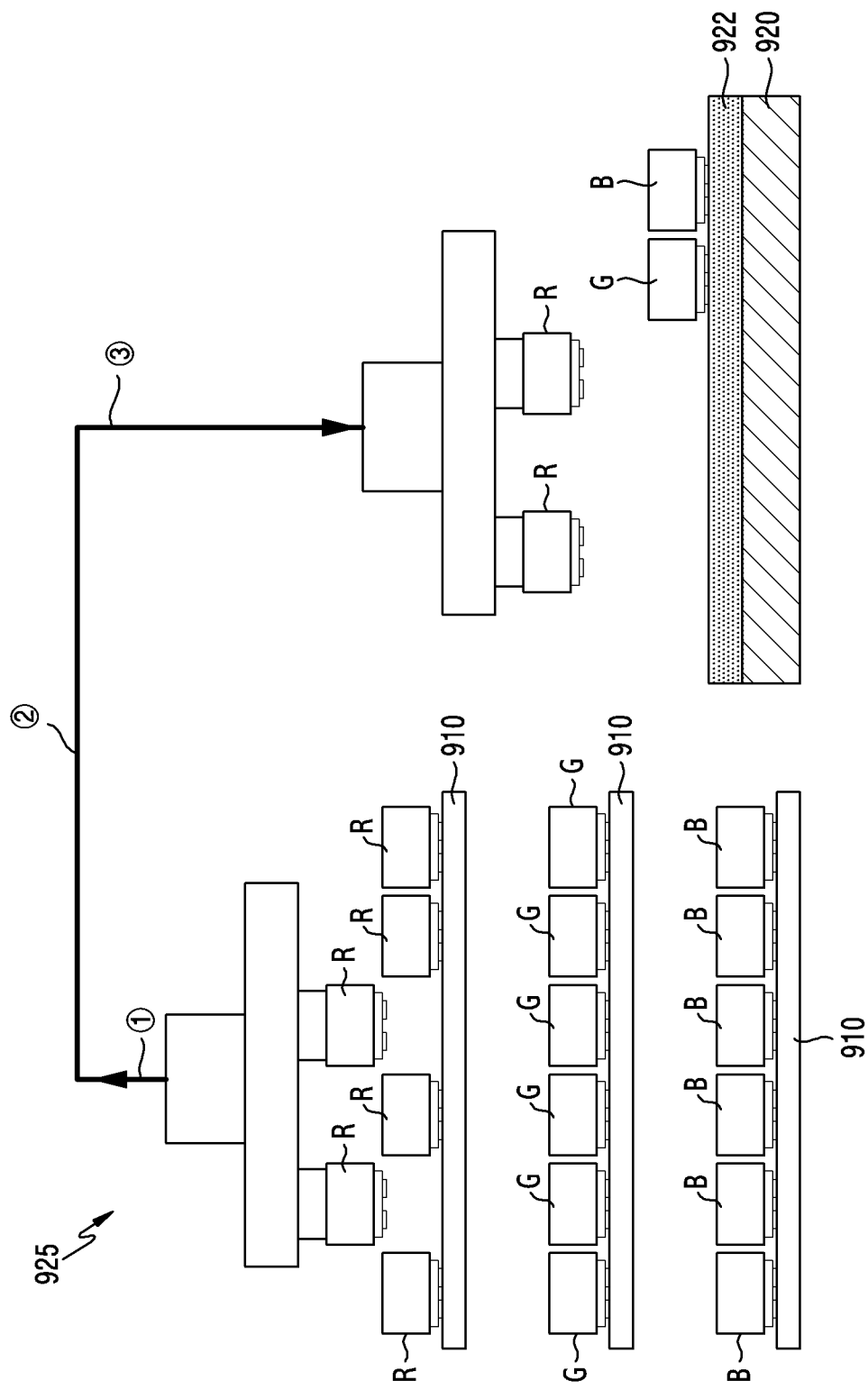
FIG. 9 is a view illustrating a process of redistributing a plurality of micro LED chips prepared according to various embodiments.

FIG. 9 is a view illustrating a process of redistributing a plurality of micro LED chips prepared according to various embodiments.

Referring to FIG. 9, the plurality of micro LED chips R/G/B attached in alignment with one another may be redistributed on a temporary fixing film 122 according to factors of a display pixel, for example, a pitch, color (R/G/B), a gap.

Hereinafter, the micro LED chips are represented by R, G, B. R indicates a micro LED chip emitting red, G indicates a micro LED chip emitting green, and B indicates an LED chip emitting blue.

For example, a method for redistributing the plurality of micro LEDs R/G/B may pick up respective micro LED chips R/G/B by using a pickup device 925 (pickup tool or piker), and may fix the micro LED chips to a temporary fixing film 922.

In addition, the method for redistributing the plurality of micro LED chips R/G/B may apply any one of the following methods of: picking up the micro LED chips R/G/B and moving the micro LED chips to the temporary fixing film; picking up the micro LED chips R/G/B by using static electricity and fixing the micro LED chips to the temporary fixing film; picking up the micro LED chips R/G/B by using a magnetic field and fixing the micro LED chips to the temporary fixing film; picking up the micro LED chips R/G/B by using a vacuum force and fixing the micro LED chips to the temporary fixing film; or picking up the micro LED chips R/G/B by using a difference in an adhesive force of a tape and fixing the micro LED chips to the temporary fixing film.

After the micro LEDs B aligned to emit blue, the micro LEDs G aligned to emit green, and the micro LEDs R to emit red are prepared, micro LEDs R/G/B selected by the pickup device 925 may be moved and redistributed on the temporary fixing film 922. The arrow direction ①, ②, ③ indicates a moving direction of the pickup device 925. The moving direction of the pickup device 925 indicates that the selected micro LED chips R/G/B are moved up in the vertical direction ① and then are moved in the horizontal direction ②, and are moved downward in the vertical direction ③, and finally, the moved micro LED chips R/G/B are placed down on the temporary fixing film 925 and are redistributed. The moved micro LED chips R/G/B may be fixed in the state in which RGB are redistributed as a single set. The temporary fixing film 925 may be attached to a carrier film 920. Thereafter, the micro LED chips attached to the temporary fixing film 925 may be fabricated in a board type by a molding process and may be fixed by a molding part.

Hereinafter, a structure of a device for redistributing micro LED chips in a process of fabricating a micro LED display will be described with reference to the accompanying drawings.

Figure 10A:
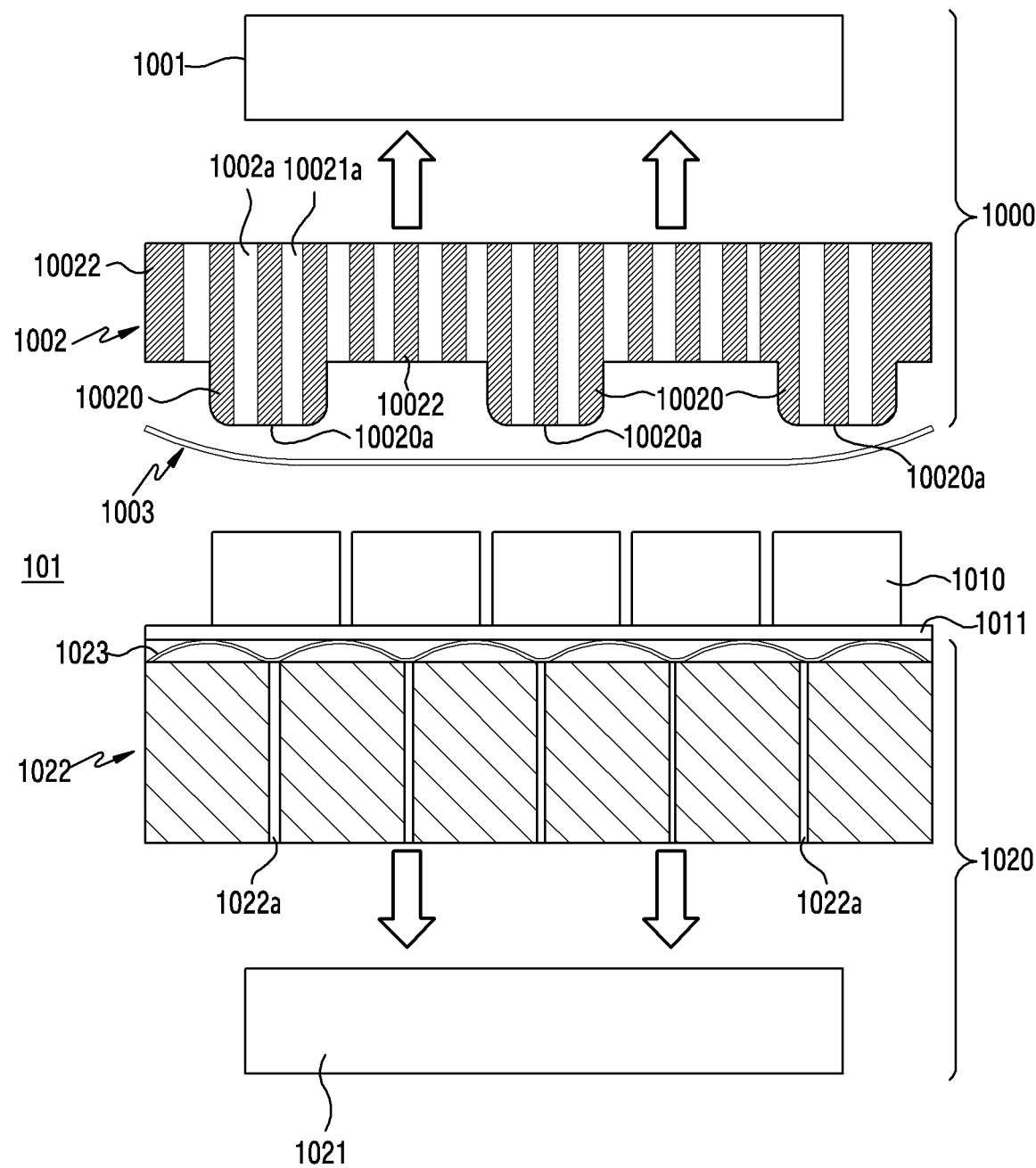
FIG. 10A is a view illustrating a redistribution device of micro LED chips according to various embodiments of the disclosure, and illustrating a state before the micro LED chips are picked up.
Figure 10B:
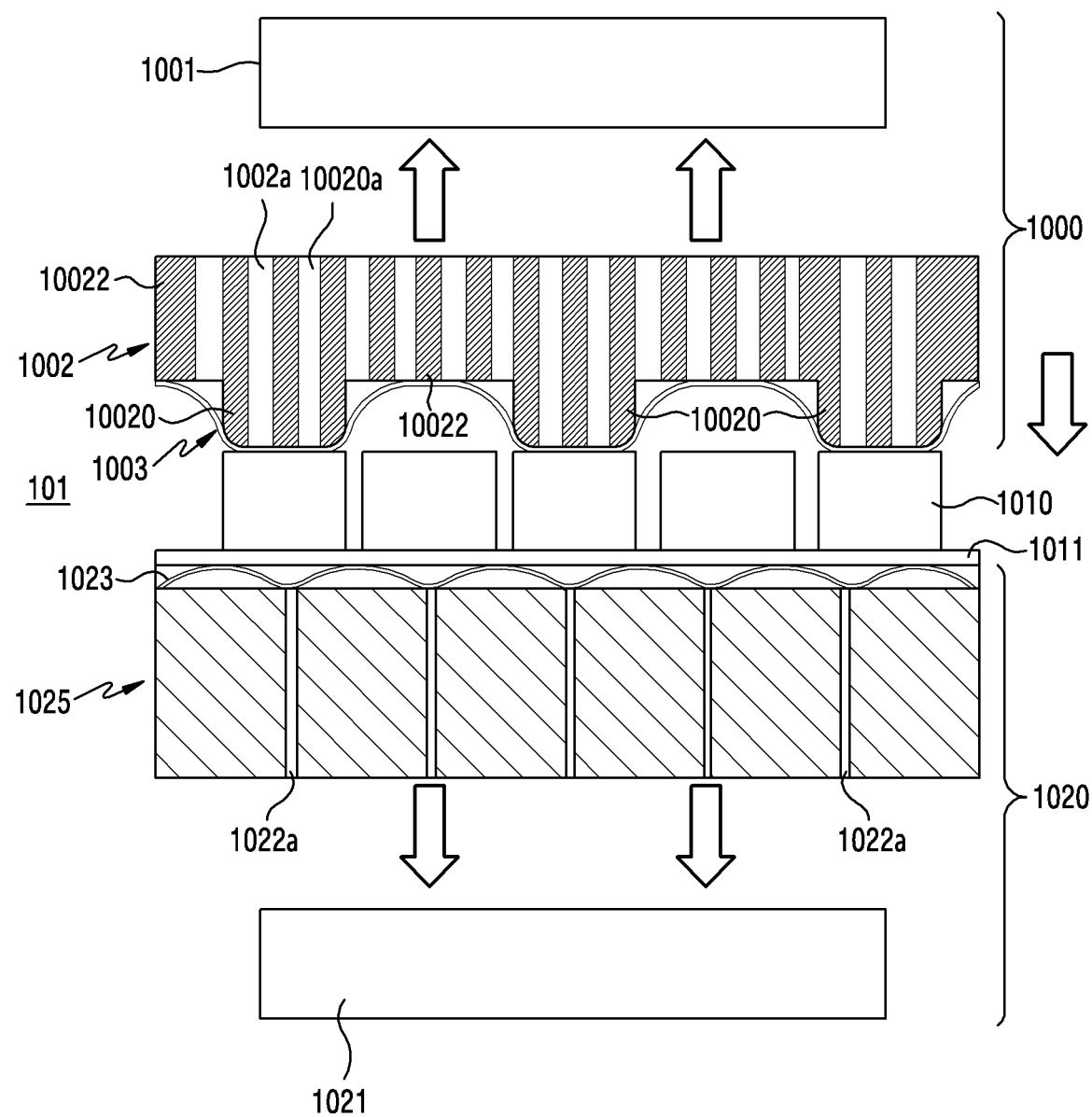
FIG. 10B is a view illustrating a state in which a first device of the redistribution device of the micro LED chips according to various embodiments of the disclosure is moved downward and is attached to selected micro LED chips.
Figure 10C:
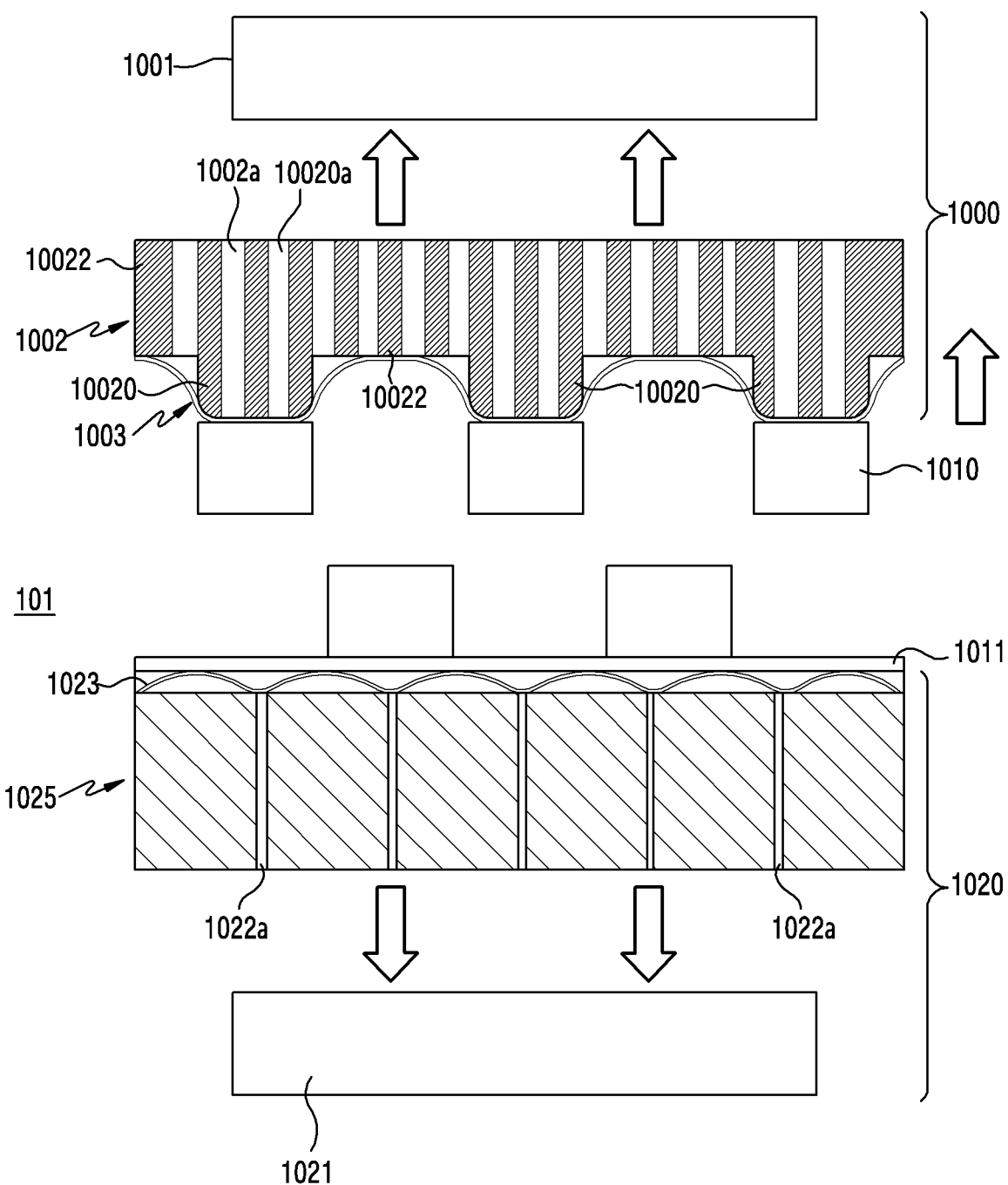
FIG. 10C is a view illustrating a state in which the first device of the redistribution device of the micro LED chips according to various embodiments of the disclosure moves up the selected micro LED chips.
Figure 10D:
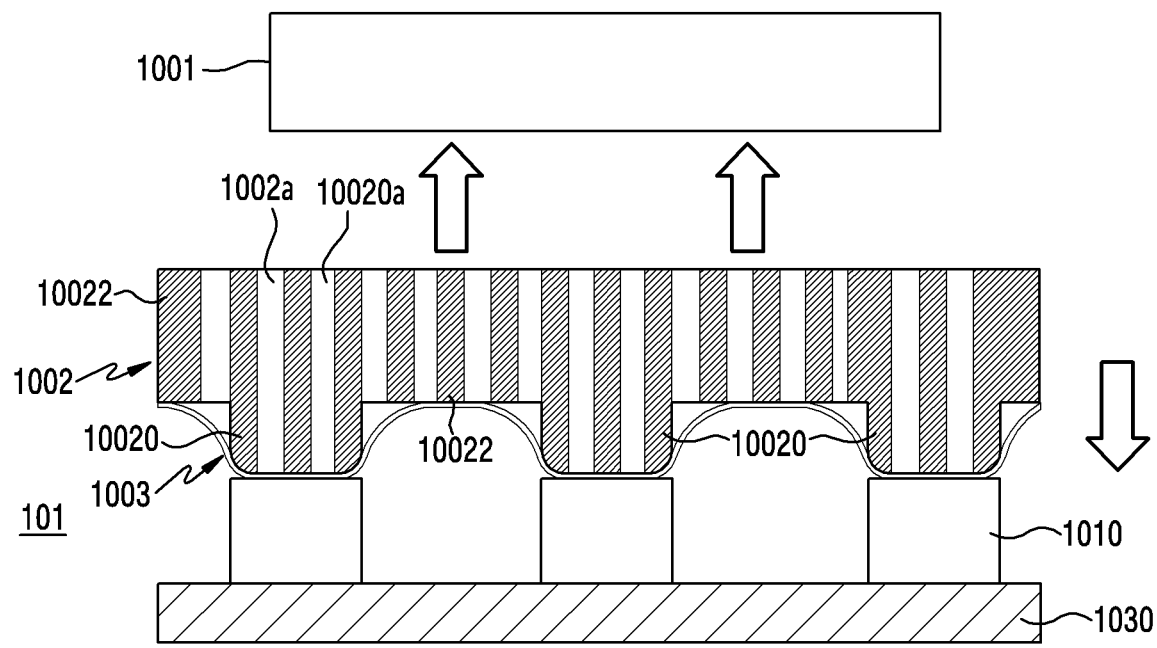
FIG. 10D is a view illustrating a state in which the first device of the redistribution device of the micro LED chips according to various embodiments of the disclosure is moved horizontally and then is moved downward, and the selected micro LED chips are attached to a temporary fixing film.

FIG. 10A is a view illustrating a redistribution device of micro LED chips according to various embodiments of the disclosure, and illustrating a state before the micro LED chips are picked up. FIG. 10B is a view illustrating a state in which a first device of the redistribution device of the micro LED chips according to various embodiments of the disclosure is moved downward and is attached to selected micro LED chips. FIG. 10C is a view illustrating a state in which the first device of the redistribution device of the micro LED chips according to various embodiments of the disclosure moves up the selected micro LED chips. FIG. 10D is a view illustrating a state in which the first device of the redistribution device of the micro LED chips according to various embodiments of the disclosure is moved horizontally and then is moved downward, and the selected micro LED chips are attached to a temporary fixing film.

Referring to FIGS. 10A to 10D, a configuration of the redistribution device 101 of the micro LED chips according to various embodiments of the disclosure (hereinafter, referred to as a "redistribution device") will be described. The redistribution device 101 of the disclosure may arrange prepared micro LED chips 1010 in a single set state of RGB.

The redistribution device 101 according to various embodiments may include a first device 1000 which selectively picks up, transfers, and then places down prepared micro LED chips 1010. In addition, the redistribution device 101 according to various embodiments may include a second device 1020 to prevent a micro LED chip which is not picked up and is adjacent to a picked-up micro LED chip from among the prepared micro LED chips 1010 from being warped or moved. For example, the first device 1000 may be referred to as a pickup device or a transfer device, and the second device 1020 may be referred to as a fixing device or a holding device. In addition, the first device 1000 may be positioned above the prepared micro LED chips 1010 and may be referred to as an upper device, and the second device 1020 may be positioned under the prepared micro LED chips 1010 and may be referred to as a lower device.

The first device 1000 according to various embodiments may pick up the micro LED chips 1010 by using an adhesive force of an adhesive member 1003, and may exactly pick up the prepared micro LED chips 1010 by using an adsorption force.

The prepared micro LED chips 1010 mentioned above may be a plurality of micro LED chips attached to a carrier film 1011. The micro LED chips 1010 attached to the carrier film 1011 may be disposed on the second device 1020 prior to being picked up, and a pre-picking up state may be prepared.

The first device 1000 according to various embodiments may include a first vacuum portion 1001, a first porous material portion 1002, and a first adhesive member 1003. The first vacuum portion 1001 may be sealed and accommodated in an external casing frame (not shown), and may be spatially connected with the first porous material portion 1002. For example, the first vacuum portion 1001 may be turned on or off by a controller (not shown).

The first porous material portion 1002 according to various embodiments may include a plurality of first penetrating openings 1002a spatially connected with the first vacuum portion 1001. Each of the first penetrating openings 1002a may be regularly arranged in the first porous material portion 1002. However, the first penetrating openings 1002a may be irregularly arranged, and may symmetrically or asymmetrically arranged. In addition, the first penetrating openings 1002a may be linearly extended in cross section. However, the cross-section shape of the first penetrating opening is not limited to a linear shape and may be configured in a non-linear shape, for example, a curved shape.

In addition, each of the first penetrating openings 1002a may be formed in a hole shape, and a first portion (one end portion) may face toward the first vacuum portion 1001 and a second portion (the other end portion) may face toward the first adhesive member 1003 and may face the first adhesive member 1003. For example, according to an on-operation of the first vacuum portion 1001, the first adhesive member 1003 may be adsorbed onto the first porous material portion. The first porous material portion 1002 according to various embodiments may include at least one concavo-convex portion formed on a portion facing the first adhesive member 1003. The concavo-convex portions may be repeatedly formed on the first porous material portion 1002 at equal intervals.

For example, the concavo-convex portion may include a convex portion 10020 and a concave portion 10022 disposed adjacent to the convex portion 10020. The micro LED chip 1010 may be selectively picked up by the convex portion 10020. The convex portion 10020 may protrude downward and may be spaced apart from the prepared micro LED chip 1010, facing the prepared micro LED chip 1010. This state is illustrated in FIG. 10A. The concavo-convex portion may have the convex portion 10020 and the concave portion 10022 alternately arranged along a portion of the first porous material portion 1002 facing the first adhesive member 1003. The convex portions 10020 may be formed to have the same height. In addition, the concavo-convex portion may be fabricated through a laser process, a plasma process or a machine process.

According to the configuration of the first porous material portion 1002, the micro LED chip 1010 may be attached to a portion of the first adhesive member 1003 facing each of the convex portions 10020, and may be selectively attached.

The convex portion 10020 according to various embodiments may include an adsorption surface 10020a facing the first adhesive member 1003, and according to an on-operation of the first vacuum portion 1001, the adsorption surface 10020a may be adsorbed onto at least a portion of the first adhesive member 1003. In addition, when the first vacuum portion 1001 is turned off, at least a portion of the first adhesive member 1003 may be spaced apart from the convex portion 10020 or the adsorption surface 10020a of the convex portion.

The second device 1020 according to various embodiments may include a second vacuum portion 1021, a second porous material portion 1022, and a second adhesive member 1023. The second vacuum portion 1021 may be sealed and accommodated in an external casing frame, and may be spatially connected with the second porous material portion 1022. For example, the second vacuum portion 1021 may be turned on or off by a controller (not shown).

The second porous material portion 1022 according to various embodiments may include a plurality of second penetrating openings 1022a spatially connected with the second vacuum portion 1001. The second penetrating openings 1022a may be regularly arranged in the second porous material portion 1022. However, the second penetrating openings 1022a may be irregularly arranged and may be symmetrically or asymmetrically arranged. In addition, the second penetrating opening 1022a may be linearly extended in cross section. However, the cross-section shape of the second penetrating opening is not limited to the linear shape and may be formed in a non-linear shape, for example, a curved shape.

Each of the second penetrating openings 1022a may be formed in a hole shape, and a first portion (one end portion) may face toward the second vacuum portion 1021 and a second portion may face toward the second adhesive member 1023 and may face the second adhesive member 1023.

For example, according to an on-operation of the second vacuum portion 1021, the second adhesive member 1023 may be adsorbed onto the second porous material portion 1022.

The second adhesive member 1023 according to various embodiments may be fixed to the second porous material portion 1022, and may be disposed to be adsorbed onto the second porous material portion 1022 by the second vacuum portion 1021. For example, the second adhesive member 1023 may have at least a part thereof attached to the carrier film 1011 to which the plurality of micro LED chips 1010 are attached.

In the redistribution device 100 according to various embodiments, the first, second porous material portions 1002, 1022 may be configured differently from each other. The different configurations may be numbers, shapes, or diameter sizes of the first, second penetrating openings 1002a, 1022a. For example, the first penetrating openings 1002a may be more than the second penetrating openings 1022a. In addition, a diameter size of the first penetrating opening 1002a may be larger than a diameter size of the second penetrating opening 1022a.

According to such configurations, a first adsorption force attributable to the first vacuum portion 1001 through the first penetrating openings 1002a may be greater than a second adsorption force attributable to the second vacuum portion 1021 through the second penetrating openings 1022a.

Materials of the first, second porous material portions 1002, 1022 according to various embodiments may include at least one of metal including aluminum oxide, a film, a wafer, ceramic.

Materials of the first, second adhesive members 1003, 1023 according to various embodiments may include an ultraviolet curing material or thermal foaming resin including any one of epoxy, acryl, polyester, polyurethane, silicon.

The plurality of micro LED chips 10010 may be redistributed on a prepared temporary fixing film 1030 in an alignment state by the redistribution device 101 according to various embodiments. A first adhesive force between the picked up micro LED chip 1010 and the first adhesive member 1003 may be smaller than a second adhesive force between the placed down micro LED chip 1010 and the temporary fixing film 1030. Due to the difference in the adhesive force, the micro LED chip 210 may be attached to the temporary fixing film 1030.

The first adsorption force owned by the first adhesive member 1003 enables the prepared micro LED chip 1010 to be exactly picked up, and the second adsorption force owned by the second adhesive member 1023 prevents a micro LED chip which is not picked up and is adjacent to the picked up micro LED chip 1010 from being warped, such that the redistribution device 100 according to the disclosure can exactly pick up the lots of micro LED chips at a time and can redistribute the micro LED chips.

Figure 11A:
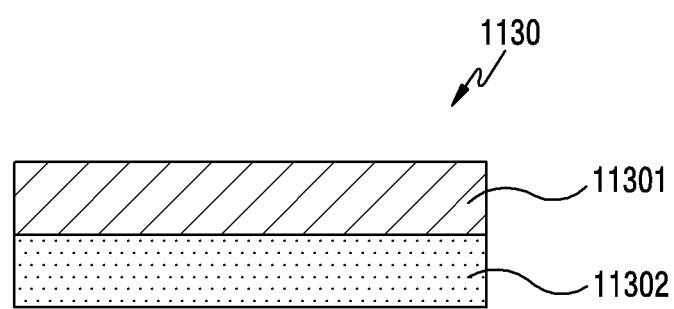
FIG. 11A is a view illustrating a cross section of an adhesive member according to various embodiments of the disclosure.

FIG. 11A is a view illustrating a cross section of an adhesive member according to various embodiments of the disclosure.

Figure 11B:
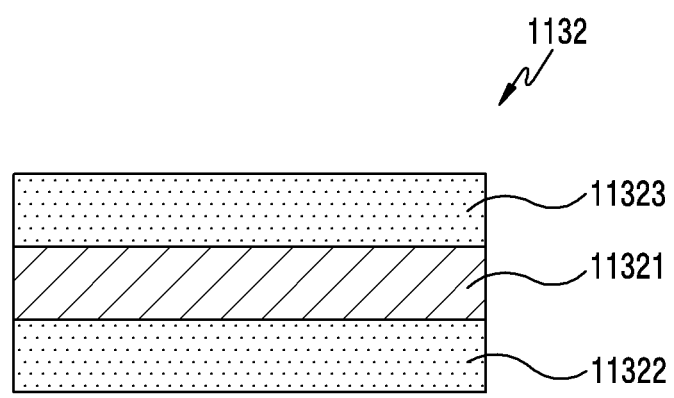
FIG. 11B is a view illustrating a cross section of another adhesive member according to various embodiments of the disclosure.

FIG. 11B is a view illustrating a cross section of another adhesive member according to various embodiments of the disclosure.

Referring to FIGS. 11A, 11B, each of first, second adhesive tapes may be configured by any one of a one-sided tape or a double-sided tape.

Referring to FIG. 11A, the adhesive member 1130 according to various embodiments may be the same as the first adhesive member 1003 shown in FIG. 10A. The adhesive member 1130 according to various embodiments may include a resin layer 11301 and an adhesive layer 11302 formed on one surface of the resin layer 11301. A prepared micro LED chip may be attached to the adhesive layer 11302. The adhesive member 1130 may be referred to as a one-sided attachment tape.

Referring to FIG. 11B, the adhesive member 1132 according to various embodiments may be the same as the first adhesive member 1003 shown in FIG. 10A. The adhesive member 1132 according to various embodiments may include a resin layer 11321 and first, second adhesive layers 11322, 11323 formed on one surface and the other surface of the resin layer 11321. A prepared micro LED chip may be attached to the first adhesive layer 11322. The adhesive member 1132 may be referred to as a double-sided attachment tape.

In addition, the embodiments disclosed in the disclosure and the drawings are suggested for easy explanation of the technical features according to embodiments of the disclosure and better understanding of the embodiments of the disclosure, and are not intended to limit the scope of the embodiments of disclosure. Therefore, the scope of various embodiments of the disclosure should be interpreted as including all changes or modified forms derived based on the technical idea of the disclosure, in addition to the embodiments disclosed herein.

What is claimed is:

1. An electrical element transfer apparatus comprising:
a fixing jig comprising a plurality of second accommodation grooves configured to receive at least a part of each of a plurality of electrical elements when the plurality of elements are fixed in the fixing jig;
a movement jig movably disposed on an upper portion of the fixing jig, and comprising a plurality of first accommodation grooves configured to receive at least a part of each of the plurality of electrical elements fixed in the fixing jig when the movement jig faces the fixing jig; and
an attraction device disposed in proximity of the movement jig and configured to attach each of the plurality of electrical elements to the first accommodation groove of the movement jig using magnetism through the movement jig, and
wherein, when the movement jig faces the fixing jig, respective spaces formed by each first accommodation groove and a corresponding second accommodation groove are equal to or larger than an electrical element size.

2. The apparatus of claim 1, wherein the attraction device comprises a magnetism generator configured to attract a magnetic element of each of the plurality of electrical elements fixed in the fixing jig toward the movement jig through the movement jig on an upper portion of the movement jig.

3. The apparatus of claim 2, wherein the electrical element comprises a micro LED, and the magnetic element of each of the plurality of electrical element comprises a metallic member.

4. The apparatus of claim 1, further comprising a vacuum device configured to suck electrical elements fixed in the fixing jig into the first accommodation grooves.

5. The apparatus of claim 1, wherein the electrical element transfer apparatus is configured to transfer electrical elements redistributed in the fixing jig from a base material board to a board of an electronic device.

* * * * *